(12) United States Patent
Lu et al.

(10) Patent No.: US 11,756,842 B2
(45) Date of Patent: Sep. 12, 2023

(54) DAISY-CHAIN SEAL RING STRUCTURE

(71) Applicant: Taiwan Semiconductor Manufacturing Company, Ltd., Hsinchu (TW)

(72) Inventors: Chun-Liang Lu, Tainan (TW); Chun-Wei Chia, Kaohsiung (TW); Chun-Hao Chou, Tainan (TW); Kuo-Cheng Lee, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 118 days.

(21) Appl. No.: 17/448,002

(22) Filed: Sep. 17, 2021

(65) Prior Publication Data

US 2022/0336299 A1 Oct. 20, 2022

Related U.S. Application Data

(60) Provisional application No. 63/201,191, filed on Apr. 16, 2021.

(51) Int. Cl.
*H01L 23/58* (2006.01)
*H01L 29/10* (2006.01)
*H01L 21/66* (2006.01)
*H01L 23/00* (2006.01)

(52) U.S. Cl.
CPC .......... *H01L 22/34* (2013.01); *H01L 23/585* (2013.01); *H01L 24/08* (2013.01); *H01L 24/80* (2013.01); *H01L 2224/08135* (2013.01); *H01L 2224/80895* (2013.01)

(58) Field of Classification Search
CPC combination set(s) only.
See application file for complete search history.

(56) References Cited

U.S. PATENT DOCUMENTS

| | | | | |
|---|---|---|---|---|
| 11,031,308 | B2* | 6/2021 | Lee | ......................... H01L 24/06 |
| 2008/0122039 | A1* | 5/2008 | Liu | ......................... H01L 24/03 |
| | | | | 257/773 |
| 2009/0121321 | A1* | 5/2009 | Miccoli | ................ G03F 9/7084 |
| | | | | 257/E23.179 |
| 2022/0165665 | A1* | 5/2022 | Chang | ..................... H01L 24/80 |

\* cited by examiner

*Primary Examiner* — Niki H Nguyen
(74) *Attorney, Agent, or Firm* — Harrity & Harrity, LLP

(57) ABSTRACT

A semiconductor device includes a first wafer and a second wafer. The semiconductor device includes a seal ring structure comprising a first metal structure in a body of the first wafer, a second metal structure in the body of the first wafer, a third metal structure in a body of the second wafer, and a metal bonding structure including a first set of metal elements coupling the first metal structure and the third metal structure through an interface between the first wafer and the second wafer, and a second set of metal elements coupling the second metal structure and the third metal structure through the interface between the first wafer and the second wafer.

20 Claims, 28 Drawing Sheets

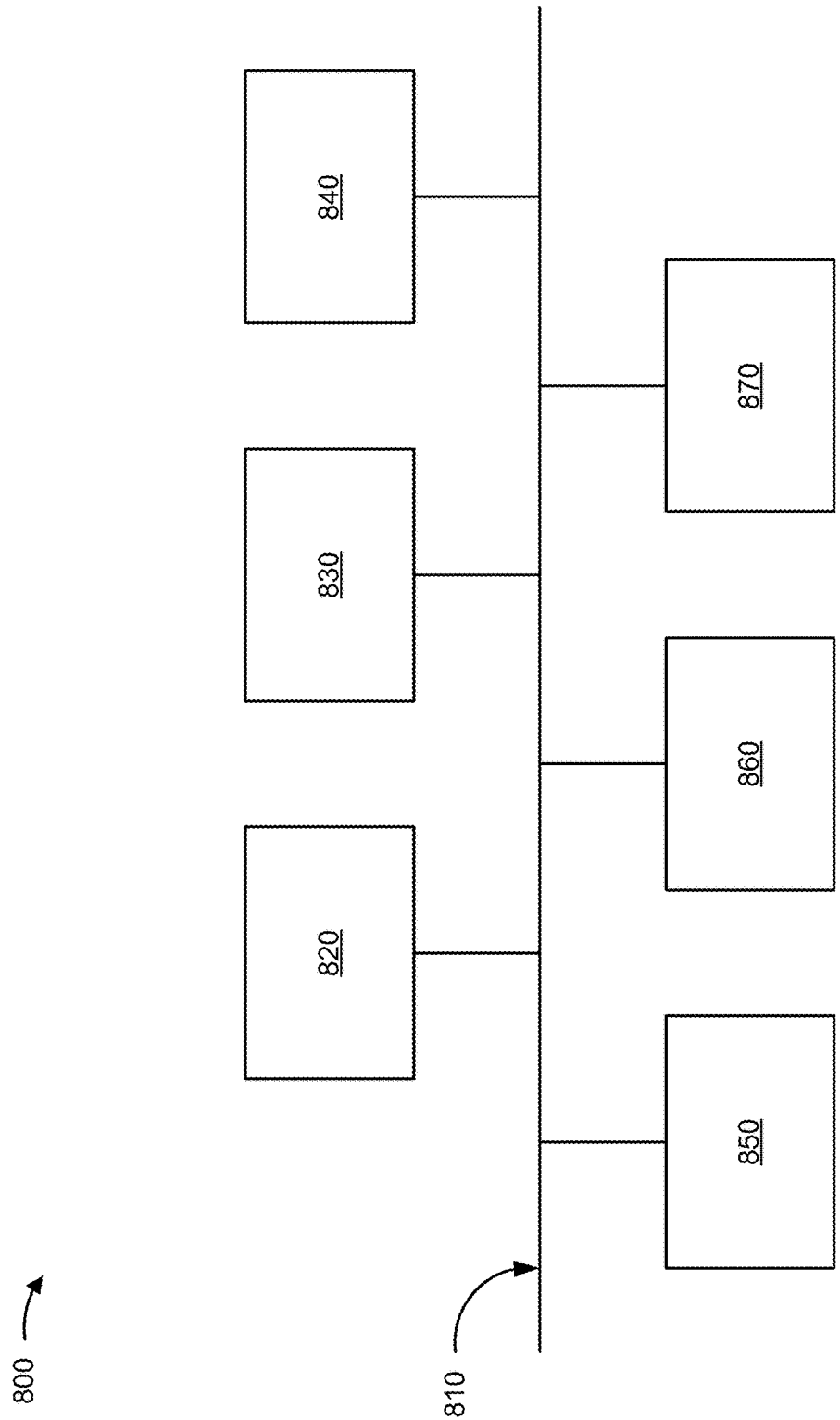

DAISY-CHAIN SEAL RING STRUCTURE

CROSS-REFERENCE TO RELATED APPLICATION

This patent application claims priority to U.S. Provisional Patent Application No. 63/201,191, filed on Apr. 16, 2021, and entitled "DAISY CHAIN SEAL RING STRUCTURE." The disclosure of the prior application is considered part of and is incorporated by reference into this patent application.

BACKGROUND

A semiconductor device, such as a complementary metal-oxide-semiconductor (CMOS) integrated circuit (e.g., a CMOS image sensor), may comprise multiple semiconductor dies which are stacked upon one another. Generally, such a semiconductor device includes a seal ring structure. A seal ring structure is a structure formed between a scribe line and a semiconductor device circuit and is designed, in part, to reduce or prevent wafer cracking from occurring when cutting or sawing a wafer of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a diagram of example components of one or more devices of FIG. 1.

DETAILED DESCRIPTION

Figure 1:
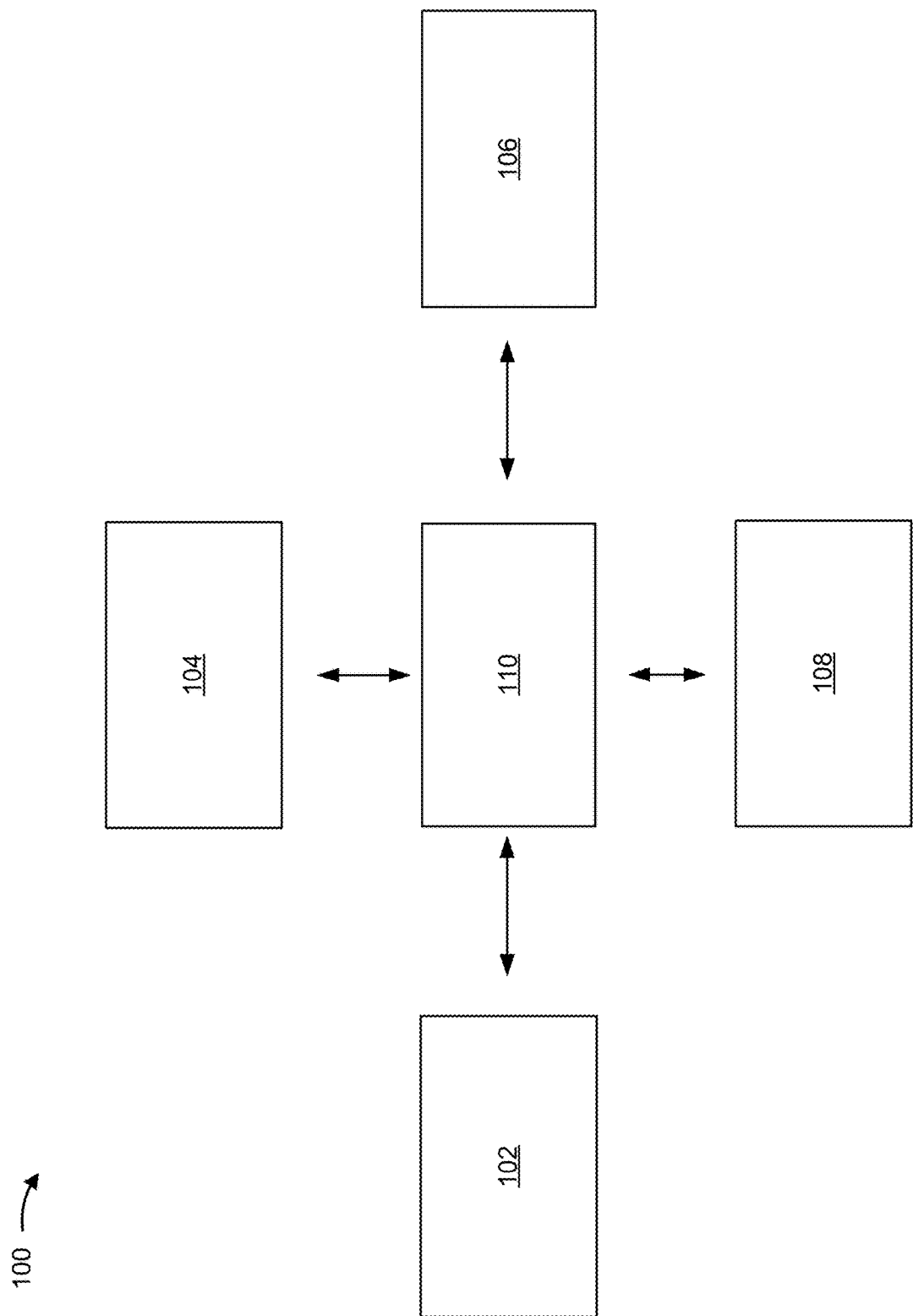
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A seal ring structure, of a semiconductor device, can be formed between a scribe line and a semiconductor device circuit. The seal ring structure may be designed, in part, to reduce or prevent wafer cracking from occurring during cutting or sawing of a wafer of the semiconductor device. However, a seal ring structure may not sufficiently protect from wafer cracking in the presence of cutting or sawing stress, particularly when semiconductor wafers are affixed to one another (e.g., stacked and bonded together) to form the semiconductor device. For example, a CMOS integrated circuit (e.g., a CMOS image sensor) may include a first wafer (e.g., an application-specific integrated circuit (ASIC)) and a second wafer (e.g., a system on chip (SOC)), where the first wafer and the second wafer are bonded at an interface in association with forming the CMOS integrated circuit. Here, a seal ring structure can be formed in the first wafer and/or the second wafer (e.g., around perimeter of the CMOS integrated circuit). However, due to the presence of the bonded interface, reliability, die-sawing stress reduction, and/or contamination prevention provided by the seal ring structure may be inadequate. Notably, wafer cracking is increasingly likely as a size of the semiconductor device becomes smaller.

Some implementations described herein provide a daisy chain seal ring structure for reducing or preventing wafer cracking. For example, in some implementations, a semiconductor device may include a first wafer, a second wafer, and a seal ring structure. The seal ring structure may include a first metal structure in a body of the first wafer, a second metal structure in the body of the first wafer, a third metal structure in a body of the second wafer, and a metal bonding structure. In some implementations, the metal bonding structure includes a first set of metal elements coupling the first metal structure and the third metal structure through an interface between the first wafer and the second wafer, and a second set of metal elements coupling the second metal structure and the third metal structure through the interface between the first wafer and the second wafer. In some implementations, the seal ring structure may include one or more additional metal structures and sets of metal elements coupled in a similar manner. Thus, the seal ring structure, in some implementations, has a series of metal structures coupled in a linear fashion by metal elements of the metal bonding structure. Such a structure is herein referred to as a daisy chain seal ring structure.

In some implementations, the daisy chain seal ring structure described herein improves reliability of the seal ring structure and/or reduces stress induced at the interface of the semiconductor device during a sawing or cutting process. For example, in some implementations, the daisy chain seal ring structure further reduces stress (e.g., induced due to stress from a die sawing or cutting process) at the interface of the first wafer and the second wafer, thereby improving reliability and reducing stress at the interface and, as a result, reducing a likelihood of wafer cracking. Further, the seal ring structure described herein can improve contamination prevention (e.g., by preventing contaminants from penetrating the semiconductor device circuit). For these reasons, the seal ring structure described can improve manufacturing yield of a semiconductor device, such as a CMOS integrated circuit, and reduce manufacturing downtime.

Additionally, in some implementations, the daisy chain seal ring structure may be configured with at least a portion of a test pattern to be used in association with performing a wafer testing process (e.g., wafer acceptance test (WAT)). That is, in some implementations, a test pattern may be at least partially incorporated in the daisy chain seal ring structure. In such a case, the semiconductor device may further include one or more trench structures over portions of the seal ring structure (e.g., to enable providing a test signal input to the daisy chain seal ring structure, to enable receiving a test signal output from the daisy chain seal ring structure). Typically, the test pattern is entirely within a scribe line region of the wafer (rather than over or within the seal ring structure). Therefore, in an implementation in which the test pattern is at least partially incorporated in the daisy chain seal ring structure, a size of the scribe line region can be reduced, thereby increasing a die area on the wafer (e.g., such that a quantity of semiconductor devices formed on the wafer may be increased).

FIG. 1 is a diagram of an example environment 100 in which systems and/or methods described herein may be implemented. As shown in FIG. 1, environment 100 may include a plurality of semiconductor processing tools 102-108 and a wafer/die transport tool 110. The plurality of semiconductor processing tools 102-108 may include a deposition tool 102, an etching tool 104, a planarization tool 106, a bonding tool 108, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that is capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The etching tool 104 is a semiconductor processing tool that is capable of etching various types of materials of a substrate, wafer, or semiconductor device. For example, the etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of a the substrate using a sputtering technique, a plasma-assisted etch technique (e.g., a plasma sputtering technique or another type of technique involving the use of an ionized gas to isotropically or directionally etch the one or more portions), or another type of dry etching technique.

The planarization tool 106 is a semiconductor processing tool that is capable of polishing or planarizing various layers of a wafer or semiconductor device. For example, the planarization tool 106 may include a chemical mechanical planarization (CMP) tool and/or another type of planarization tool that polishes or planarizes a layer or surface of deposited or plated material. The planarization tool 106 may polish or planarize a surface of a semiconductor device with a combination of chemical and mechanical forces (e.g., chemical etching and free abrasive polishing). The planarization tool 106 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The bonding tool 108 is a semiconductor processing tool that is capable of bonding two or more wafers (or two or more semiconductor substrates, or two or more semiconductor devices) together. For example, the bonding tool 108 may include a eutectic bonding tool that is capable of forming a eutectic bond between two or more wafers. In these examples, the bonding tool 108 may heat the two or more wafers to form a eutectic system between the materials of the two or more wafers.

Wafer/die transport tool 110 includes a mobile robot, a robot arm, a tram or rail car, an overhead hoist transfer (OHT) vehicle, an automated material handling system (AMES), and/or another type of tool that is used to transport wafers and/or dies between semiconductor processing tools 102-108 and/or to and from other locations such as a wafer rack, a storage room, or another location. In some implementations, wafer/die transport tool 110 may be a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
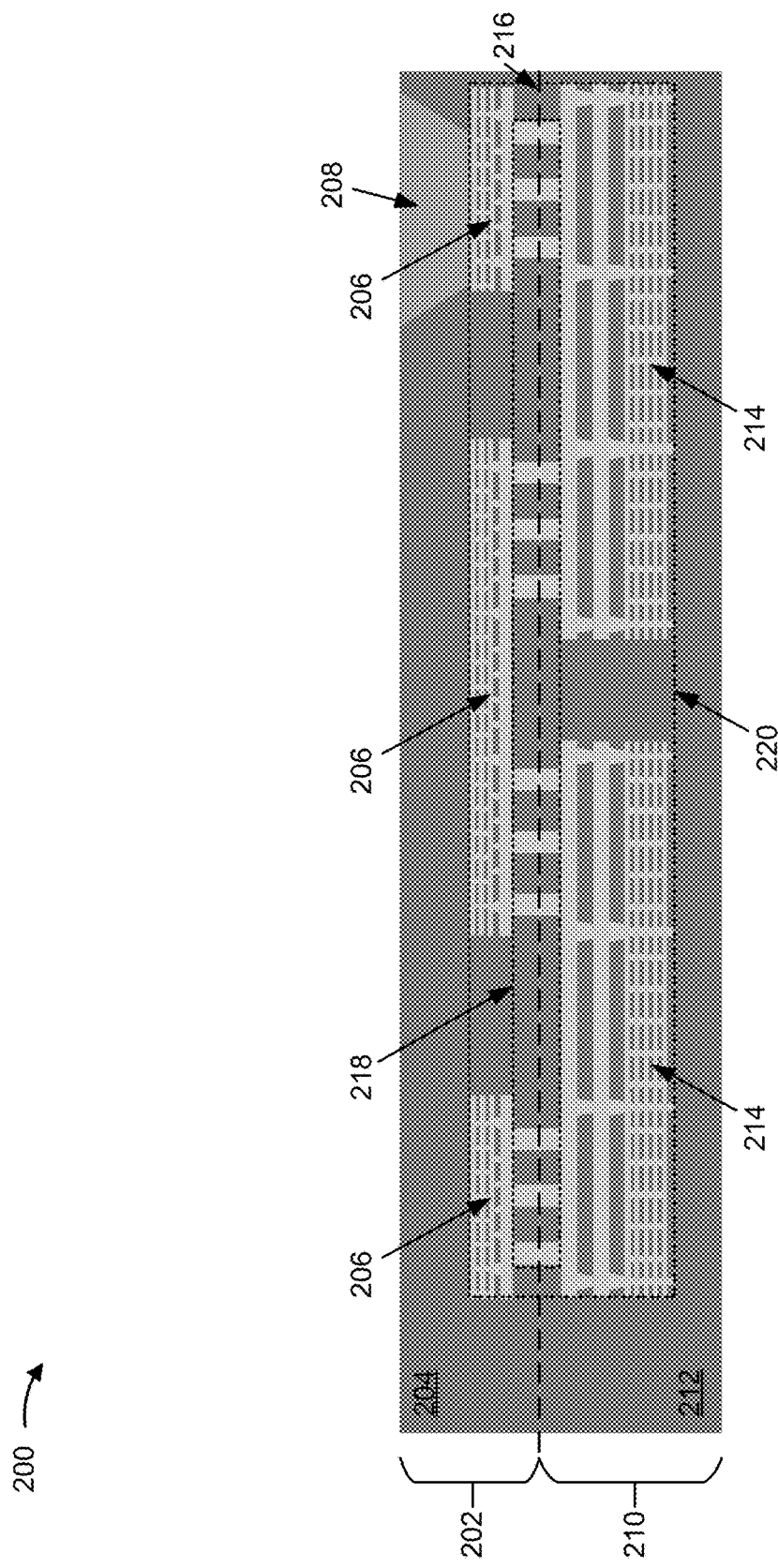
FIG. 2 is a diagram of an example semiconductor device described herein.

FIG. 2 is a diagram of an example semiconductor device 200 described herein. FIG. 2 shows a first wafer bonded to a second wafer, where a daisy chain seal ring structure is formed within the first wafer and the second wafer. In some implementations, the semiconductor device 200 includes one or more layers not shown in FIG. 2, such as one or more barrier layers, adhesion layers, metal gates, substrates, interconnects, recesses (e.g., vias), or semiconductor structures, among other examples. In some implementations, the semiconductor device 200 may include, or may be included within, a complementary metal-oxide-semiconductor (CMOS) image sensor (CIS), a 3-dimensional integrated circuit (IC), or a 3-dimensional resistive random access memory device (3D RRAM), among other examples.

As shown FIG. 2, the semiconductor device 200 includes a first wafer 202 bonded to a second wafer 210. In some implementations, the first wafer 202 and/or the second wafer 210 may include an SOC or an ASIC. For example, the first wafer 202 may include one of an SOC or an ASIC and the second wafer 210 may include the other of an SOC or an ASIC, both of the first wafer 202 and the second wafer 210 may include an SOC, or both of the first wafer 202 and the second wafer 210 may include an ASIC, among other configurations.

As shown in FIG. 2, the semiconductor device includes the first wafer 202 having a body 204 and a second wafer 210 having a body 212. The first wafer 202 includes, in the body 204, one or more metal structures 206 and one or more trench structures 208. The second wafer 210 includes, in the body 212, one or more metal structures 214. As further shown, the first wafer 202 and the second wafer 210 are bonded at an interface 216. The semiconductor device 200 further includes a metal bonding structure 218, where elements of the metal bonding structure 218 are between the one or more metal structures 206 and the one or more metal structures 214.

The first wafer 202 may include, in the body 204, one or more layers of materials, such as dielectric materials, polysilicon materials, and/or a substrate material. The dielectric materials may include one or more inter-metal dielectrics, one or more inter-layer dielectrics, or one or more dielectric bonding structures, among other dielectric semiconductor structures. For example, the dielectric materials may include a polymer layer, a silicon nitride layer, and/or a silicon dioxide layer (e.g., on a bottom surface of the body 204 to facilitate bonding), among other examples. The polysilicon materials may include, or may be included in, one or more semiconductor devices, such as a transistor (e.g., as a gate of the transistor). The substrate material may be used for a semiconductor die substrate, a semiconductor wafer, or another type of substrate in and/or on which semiconductor devices may be formed. In some implementations, the substrate material is formed of silicon (Si), a material including silicon, a III-V compound semiconductor material such as gallium arsenide (GaAs), a silicon on insulator (SOI), or another type of semiconductor material.

The one or more metal structures 206 may include multiple layers of metal material and/or may be disposed within multiple layers of the body 204. In some implementations, the one or more metal structures 206 may be elements of a daisy chain seal ring structure 220 of the semiconductor device 200. In some implementations, the one or more metal structures 206 provide a lattice structure within the body 204. In some implementations, a metal structure 206 of the one or more metal structures 206 has a width (e.g., in a direction of layers of the first wafer 202, as shown in a left-right direction in FIG. 2) that is greater than a thickness of the one or more metal structures 206 (e.g., in a direction orthogonal to the direction of layers of the first wafer 202, as shown in an up-down direction in FIG. 2). Additionally, or alternatively, the width may extend in a direction that is parallel to the top surface of the body 204 of the first wafer 202. In some implementations, a width of a metal structure 206 may be in a range from approximately 100 nanometers (nm) to approximately 500 nm. However, other values for the width of a metal structure 206 are within the scope of the present disclosure. In some implementations, the one or more metal structures 206 are embedded within the body 204 at a depth (e.g., as measured from a bottom surface of the first wafer 202 in FIG. 2) that is less than the width of the one or more metal structures 206. In this way, the one or more metal structures 206 may provide an anchor for the first wafer 202 to which elements of the metal bonding structure 218 may be connected to provide structural support for the semiconductor device 200.

In some implementations, a first metal structure 206 of the one or more metal structures 206 is embedded at a first depth, has a first width, and has a first thickness and a second metal structure 206 of the one or more metal structures 206 is embedded at a second depth, has a second width, and has a second thickness with one or more of the second depth, the second width, and/or the second thickness being different from one or more of the first depth, the first width, and/or the first thickness, respectively. In some implementations, the one or more metal structures 206 include copper material, tungsten material, cobalt material, and/or ruthenium material, among other metal materials. In some implementations, the one or more metal structures 206 may be a component of the daisy chain seal ring structure 220 of the semiconductor device 200.

The second wafer 210 may include, in the body 212, one or more layers of materials, such as dielectric materials, polysilicon materials, and/or a substrate material. The dielectric materials may include one or more inter-metal dielectrics, one or more inter-layer dielectrics, or one or more dielectric bonding structures, among other dielectric semiconductor structures. For example, the dielectric materials may include a polymer layer, a silicon nitride layer, and/or a silicon dioxide layer (e.g., on a top surface of the body 212 to facilitate bonding), among other examples. The polysilicon materials may include, or may be included in, one or more semiconductor devices, such as a transistor (e.g., as a gate of the transistor). The substrate material may be used for a semiconductor die substrate, a semiconductor wafer, or another type of substrate in and/or on which semiconductor devices may be formed. In some implementations, the substrate is formed of silicon, a material including silicon, a III-V compound semiconductor material such as gallium arsenide, a silicon on insulator, or another type of semiconductor material.

The one or more metal structures 214 may include multiple layers of metal material and/or may be disposed within multiple layers of the body 212. In some implementations, the one or more metal structures 214 may be elements of the daisy chain seal ring structure 220 of the semiconductor device 200. In some implementations, the one or more metal structures 214 may provide a lattice structure within the body 212. In some implementations, the one or more metal structures 214 may include a first quantity of layers of metal material that is different from a second quantity of layers of metal material of the one or more metal structures 214. In some implementations, a metal structure 214 of the one or more metal structures 214 has a width that is greater than a thickness of the one or more metal structures 206. Additionally, or alternatively, the width may extend in a direction that is parallel to the top surface of the body 212 of the second wafer 210. In some implementations, a width of a metal structure 214 may be in a range from approximately 100 nm to approximately 500 nm. However, other values for the width of a metal structure 214 are within the scope of the present disclosure. In some implementations, the one or more metal structures 214 are embedded within the body 212 at a depth (e.g., as measured from a top surface of the second wafer 210 in FIG. 2) that is less than the width of the one or more metal structures 214. In this way, the one or more metal structures 214 may provide an anchor for the second wafer 210 to which a metal bonding structure may be connected to provide structural support for the semiconductor device 200.

In some implementations, a first metal structure 214 of the one or more metal structures 214 is embedded at a third depth, has a third width, and has a third thickness and a second metal structure 214 of the one or more metal structures 214 is embedded at a fourth depth, has a fourth width, and has a fourth thickness with one or more of the fourth depth, the fourth width, and/or the fourth thickness being different from one or more of the third depth, the third width, and/or the third thickness, respectively. In some implementations, the one or more metal structures 214 may have depths, thicknesses, and/or lengths that are different from depths, thicknesses and/or lengths of the one or more metal structures 206. In some implementations, the one or more metal structures 214 include copper material, tungsten material, cobalt material, and/or ruthenium material, among other metal materials. In some implementations, the one or more metal structures 214 may be a component of the daisy chain seal ring structure 220 of the semiconductor device 200.

The one or more trench structures 208 may include, for example, a deep trench structure or a shallow trench structure. In some implementations, the one or more trench structures 208 are configured to prevent wafer cracking in the semiconductor device 200 (e.g., by further reducing stress at the interface 216). In some implementations, while not shown in FIG. 2, the second wafer 210 may include one or more trench structures 208 in addition to, or instead of, the first wafer 204 including one or more trench structures 208.

In some implementations, a depth of a given trench structure 208 extends to a surface of the daisy chain seal ring structure 220. For example, as illustrated in FIG. 2, a depth of a trench of a given trench structure 208 in the body 204 extends to a surface of the metal structure 206 of the daisy chain seal ring structure 220 (e.g., such that a portion of the surface of the metal structure 206 is exposed). Similarly, a depth of a given trench structure 208 in the body 212 may extend to a surface of the daisy chain seal ring structure 220 (e.g., such that a portion of the surface of the metal structure 214 is exposed). In some implementations, the depth of the trench extending to the surface of the portion of the daisy chain seal ring structure 220 enables a test pattern, incorporated in the daisy chain seal ring structure 220, to be used for performing wafer testing as described below. In some implementations, a depth of a trench structure 208 is selected based on a depth of a metal structure 206 or a metal structure 214 (e.g., the depth may be selected so as to ensure that the given trench extends to a surface of the metal structure 206 or the metal structure 214). In some implementations, a width of a trench structure 208 is selected based on a size of test pad to be used in association with wafer testing. That is, the width of the trench structure 208 may be selected so as to enable a test pad, to be used in association with performing wafer testing, to be formed in the trench structure 208 on the exposed surface of the metal structure 206/214.

In some implementations, as noted above, the one or more trench structures 208 are configured to expose a surface of a metal structure over which the trench structure 208 is formed (e.g., a metal structure 206, a metal structure 214). For example, the daisy chain seal ring structure 220 may, in some implementations, be configured with at least a portion of a test pattern to be used in association with performing wafer testing. Here, by exposing surfaces of one or more metal structures 206/214, the one or more trench structures 208 enable a test signal input to be provided to the daisy chain seal ring structure 220 and/or enable a test signal output to be received from the daisy chain seal ring structure 220. In this way, the one or more trench structures 208 enable a test pattern, incorporated at least partially in the daisy chain seal ring structure 220, to be utilized for wafer testing, thereby enabling a size of a scribe line region to be reduced (e.g., because the daisy chain seal ring structure 220 includes a useable test pattern).

In some implementations, a given trench structure 208 may have one or more side-surfaces that are substantially perpendicular to a surface of the semiconductor device 200. For example, the side-surfaces of a trench structure 208 within the body 204 of the first wafer 202 or the side-surfaces of a trench structure 208 within the body 212 of the second wafer 210 may be substantially perpendicular to the surfaces of the first wafer 202 and the second wafer 210. Additionally, or alternatively, a given trench structure 208 may have one or more side-surfaces that are not substantially perpendicular to the surface of the semiconductor device 200 (e.g., the given trench may have a sloped side-surface). For example, a trench structure 208 within the body 204 of the first wafer 202 or a trench structure 208 within the body 212 of the second wafer 210 may have one or more side-surfaces that are not substantially perpendicular to the surfaces of the first wafer 202 and the second wafer 210. In some implementations, shapes of trench structures 208 may vary among trench structures 208 in the semiconductor device 200. That is, in some implementations, a given pair of trench structures 208 may have differing shapes (e.g., defined by differently configured side-surfaces and/or different widths). Notably, the use of different side-surface configurations or trench shapes of trench structures 208 allows for different etch recipes or different etch processes to be used to form trench structures 208. In this way, formation of the trench structures 208 may be simplified. For example, because the trench structures 208 need not have the same side-surface configuration or the same shape, one or more trench structures 208 can be formed concurrently with formation other trenches on the wafer, and different trench structures 208 can be formed at different times, using different processes, using different etch recipes, or the like, meaning that formation of the trench structures 208 can be performed without significantly increasing processing steps or processing time.

Notably, although not shown in FIG. 2, the semiconductor device 200 can include one or more other semiconductor structures, such as one or more logic devices, one or more transistor structures, one or more memory cell structures, or one or more other types of semiconductor structures. The one or more other semiconductor structures may include, for example, a deep trench structure, a shallow trench structure, a logic device, a transistor structure, or another type of semiconductor structure. In some implementations, the one or more other semiconductor structures are insulated from the one or more metal structures 206/214 and/or provide insulation to the one or more metal structures 206/214.

The first wafer 202 is bonded to the second wafer 210 at an interface 216. For example, in some implementations, metal elements of the metal bonding structure 218 are coupled to the one or more metal structures 206 and to the one or more metal structures 214 and extend through the interface 216. The metal bonding structure 218 may include a copper-based material, a tungsten-based material, an aluminum-based material, or another metal material. In some implementations, the metal bonding structure 218 includes one or more elements that extend through the interface 216. In some implementations, the one or more elements of the metal bonding structure 218 may extend from the one or more metal structures 206 to the one or more metal structures 214 with an angle that is approximately 90 degrees. In this way, the one or more elements may provide improved structural support when compared to one or more elements disposed at an angle that is less than approximately 60 degrees. In some implementations, a given element of the metal bonding structure 218 includes a first metal element that extends from a metal structure 206 to the interface 216 and a second metal element that extends from a metal structure 214 to the interface 216, with the first metal element being bonded to the second metal element. In other words, the first metal element may be bonded to the second metal element at the interface 216. In this way, the first wafer 202 may be bonded to the second wafer 210 using a metal bond. In some implementations, based on the metal bonding structure 218 extending between the metal structure 206 within the body 204 of the first wafer 202 and the metal structure 214 within the body 212 of the second wafer 210, the semiconductor device 200 may reduce cracking at the interface 216 and/or may reduce stress at the interface 216.

In some implementations, metal structures 206, metal structures 214, and the metal bonding structure 218 form the daisy chain seal ring structure 220. As an example, as shown in FIG. 2, the first wafer 202 may include three metal structures 206 (e.g., a left metal structure 206, a center metal structure 206, and a right metal structure 206), and the second wafer 210 may include two metal structures 214 (e.g., a left metal structure 214 and a right metal structure 214). As further shown, the metal bonding structure 218 includes four sets of metal elements. Here, a first set of metal elements couples the left metal structure 206 and the left metal structure 214 (e.g., near a left side of the left metal structure 214). A second set of metal elements couples the center metal structure 206 and the left metal structure 214 (e.g., near a right side of the left metal structure 214). A third set of metal elements couples the center metal structure 206 and the right metal structure 214 (e.g., near a left side of the right metal structure 214). A fourth set of metal elements couples the right metal structure 206 and the right metal structure 214 (e.g., near a right side of the right metal structure 214). In this way, the metal structures 206, the metal structures 214, and the metal bonding structure 218 may be connected in a linear fashion to form the daisy chain seal ring structure 220 in the semiconductor device 200. Notably, the daisy chain seal ring structure 220 may include a different number of metal structures 206 and/or a different number of metal structures 214 than shown in FIG. 2. For example, the daisy chain seal ring structure 220 may include two metal structures 206 and a single metal structure 214 bonded by a metal bonding structure 218 including two sets of metal elements. Here, a first metal structure 206 is bonded to the metal structure 214 by a first set of metal elements, and the metal structure 214 is bonded to a second metal structure 206 by a second set of metal elements in a linear fashion to form the daisy chain seal ring structure 220.

In some implementations, the first metal element of a given element of the metal bonding structure 218 may be aligned with the second metal element of the given element of the metal bonding structure 218. In other words, a bonded pair including the first metal element and the second metal element may be aligned with a same logical axis (e.g., may extend along, and be centered on, the same logical axis). In some implementations, the first metal element and the second metal element may be approximately equal in length (e.g., from one of the metal structures 206 or 214 to the interface 216) and/or in width (e.g., along a layer of one of the body 204 or the body 212) and/or may have an approximately equal shape. Alternatively, the first metal element and the second metal element may be approximately equal in length (e.g., from one of the metal structures 206 or 214 to the interface 216), but may have differing widths and/or may have an approximately equal shape, as illustrated in FIG. 2.

In some implementations, the daisy chain seal ring structure 220 improves reliability of the seal ring structure and/or reduces stress induced at the interface 216 of the semiconductor device 200 during a sawing or cutting process. For example, the daisy chain seal ring structure 220 reduces stress (e.g., induced due to stress from a die sawing or cutting process) at the interface 216 of the first wafer 202 and the second wafer 210, thereby improving reliability and reducing stress at the interface 216 and, as a result, reducing a likelihood of wafer cracking. Further, the daisy chain seal ring structure 220 described herein can improve contamination prevention (e.g., by preventing contaminants from penetrating the semiconductor device circuit). For these reasons, the daisy chain seal ring structure 220 described herein can improve manufacturing yield, such as manufacturing of a CMOS integrated circuit, and reduce manufacturing downtime.

Additionally, in some implementations, the daisy chain seal ring structure 220 may include at least a portion of a test pattern. The test pattern is a pattern comprising one or more semiconductor structures that can be used in association with performing a wafer testing process (e.g., a WAT). In some implementations, the test pattern may be structured to be similar to a portion of another semiconductor device (e.g., a semiconductor device in a die area of the semiconductor device 200, not shown in FIG. 2). Here, when the daisy chain seal ring structure 220 includes at least some portion of a test pattern, the semiconductor device 200 may further include one or more trench structures 208 over portions of the daisy chain seal ring structure 220 (e.g., to enable providing a test signal input to the daisy chain seal ring structure 220, to enable receiving a test signal output from the daisy chain seal ring structure 220). Typically, the test pattern is entirely within a scribe line region of the wafer (rather than over or within the seal ring structure). Therefore, in an implementation in which the test pattern is at least partially incorporated in the daisy chain seal ring structure 220, a size of the scribe line region can be reduced, meaning that a die area on the wafer can be increased.

In some implementations, a surface of the body 204 of the first wafer 202 at the interface 216 and a surface of the body 212 of the second wafer 210 at the interface 216 may be bonded using one or more adhesion layers of the body 204 and/or the body 212 at the interface 216. In some implementations, the body 204 may include a structure of multiple dielectric materials that includes a polymer layer, a silicon nitride layer, and/or a silicon dioxide layer, among other example dielectric materials. For example, the structure of multiple dielectric materials may include the silicon dioxide layer at the interface 216 based on the silicon dioxide layer being configured to adhere to the body 212 (e.g., a silicon dioxide layer of the body 212 at the interface 216) using heat bonding. Thus, in some implementations, the first wafer 202 may be bonded to the second wafer 210 using a hybrid bond that includes a metal bond between the elements of the metal bonding structure 218 and a dielectric bond between the body 204 and the body 212 (e.g., using heat bonding). In some implementations, the first wafer 202 may be bonded to the second wafer 210 using a hybrid bond that may be formed at a temperature in a range of approximately 100 degrees Celsius to approximately 300 degrees Celsius. This may conserve energy used to form the hybrid bond when compared with other bonding techniques, which may require temperatures above 300 degrees Celsius.

In some implementations, based on having a hybrid bond between the first wafer 202 and the second wafer 210 at the interface 216 and, the metal bonding structure 218 extending between the one or more metal structures 206 within the body 204 of the first wafer 202 and the one or more metal structures 214 within the body 212 of the second wafer 210, the semiconductor device 200 may further reduce cracking at the interface 216 and/or may further reduce stress at the interface 216.

As indicated above, FIG. 2 is provided as an example. Other examples may differ from what is described with regard to FIG. 2.

Figure 3A:
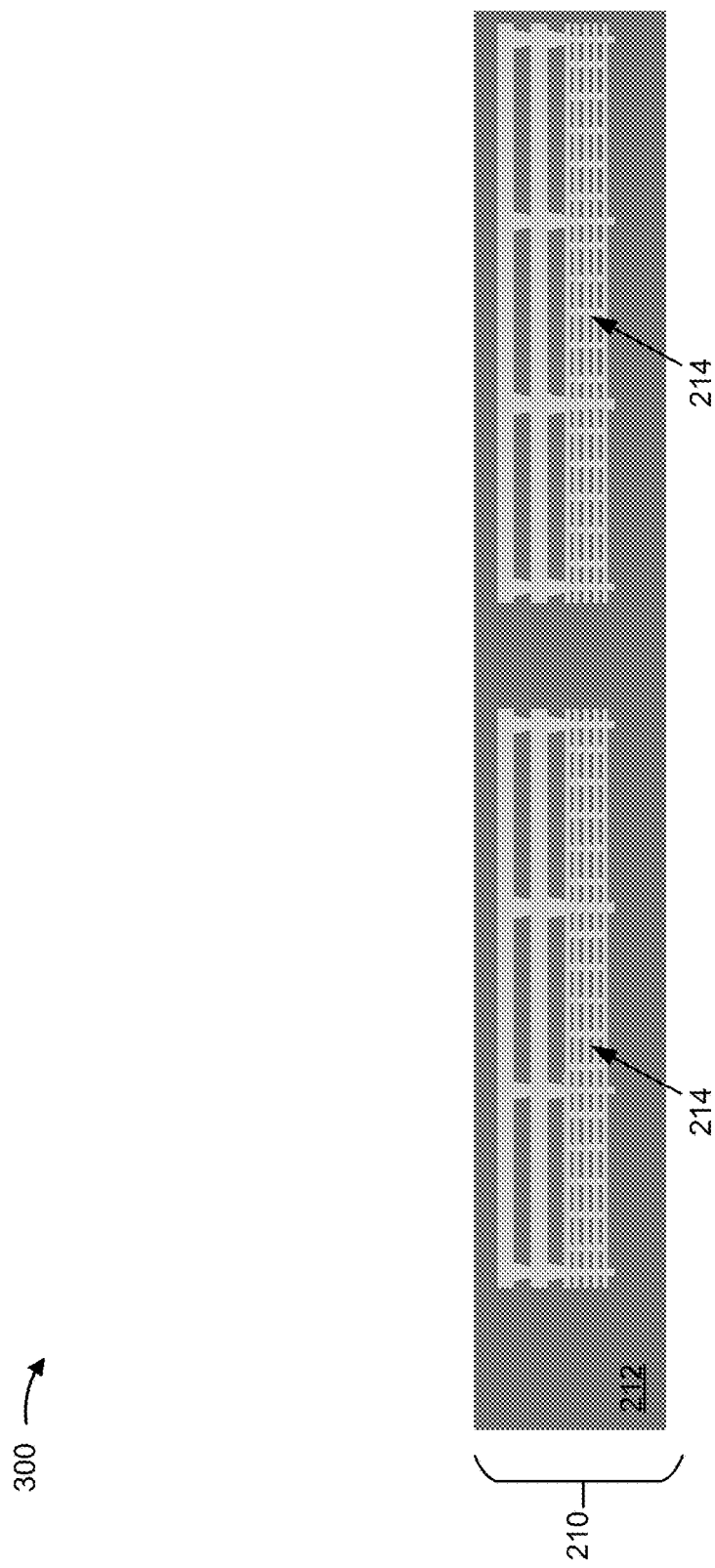
FIGS. 3A-3C are diagrams of an example implementation described herein.
Figure 3B:
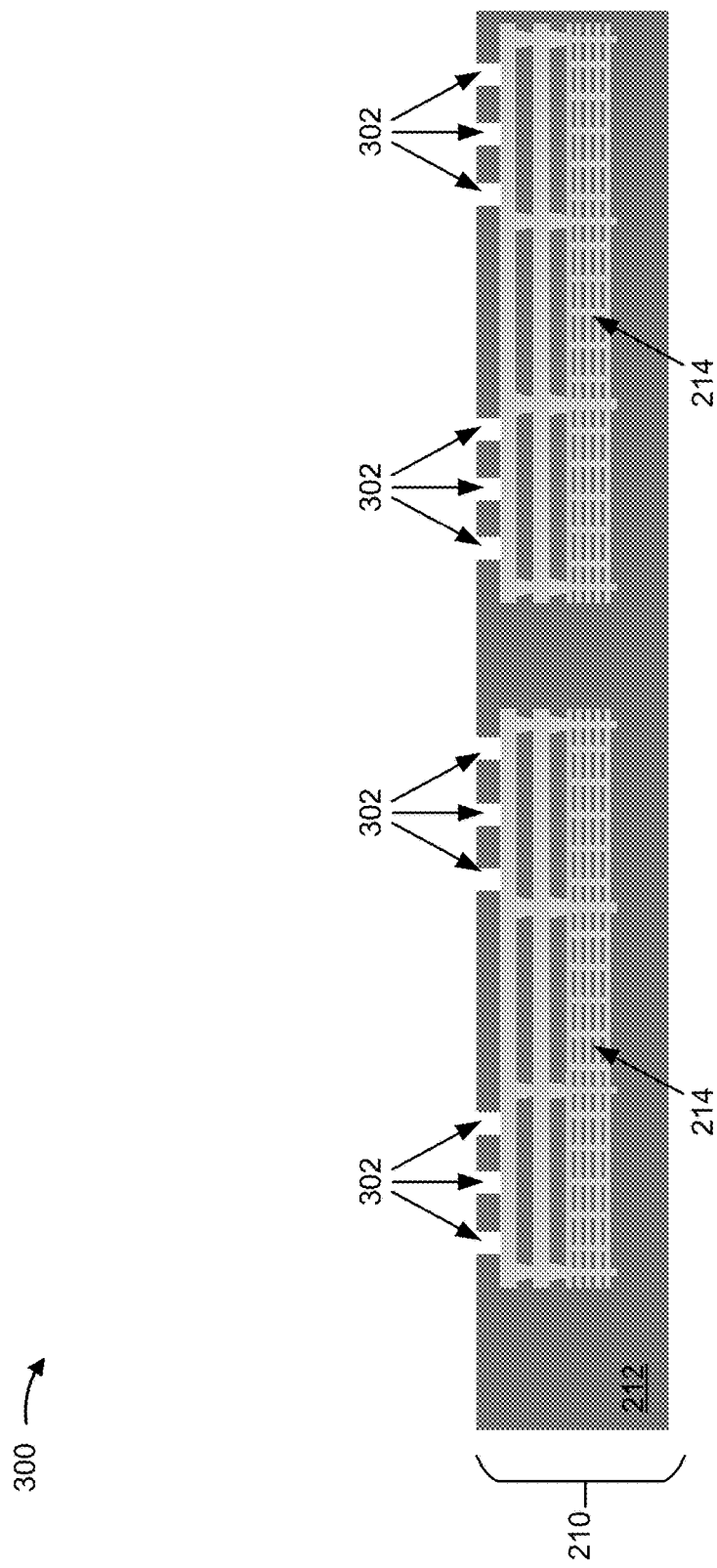
Figure 3C:
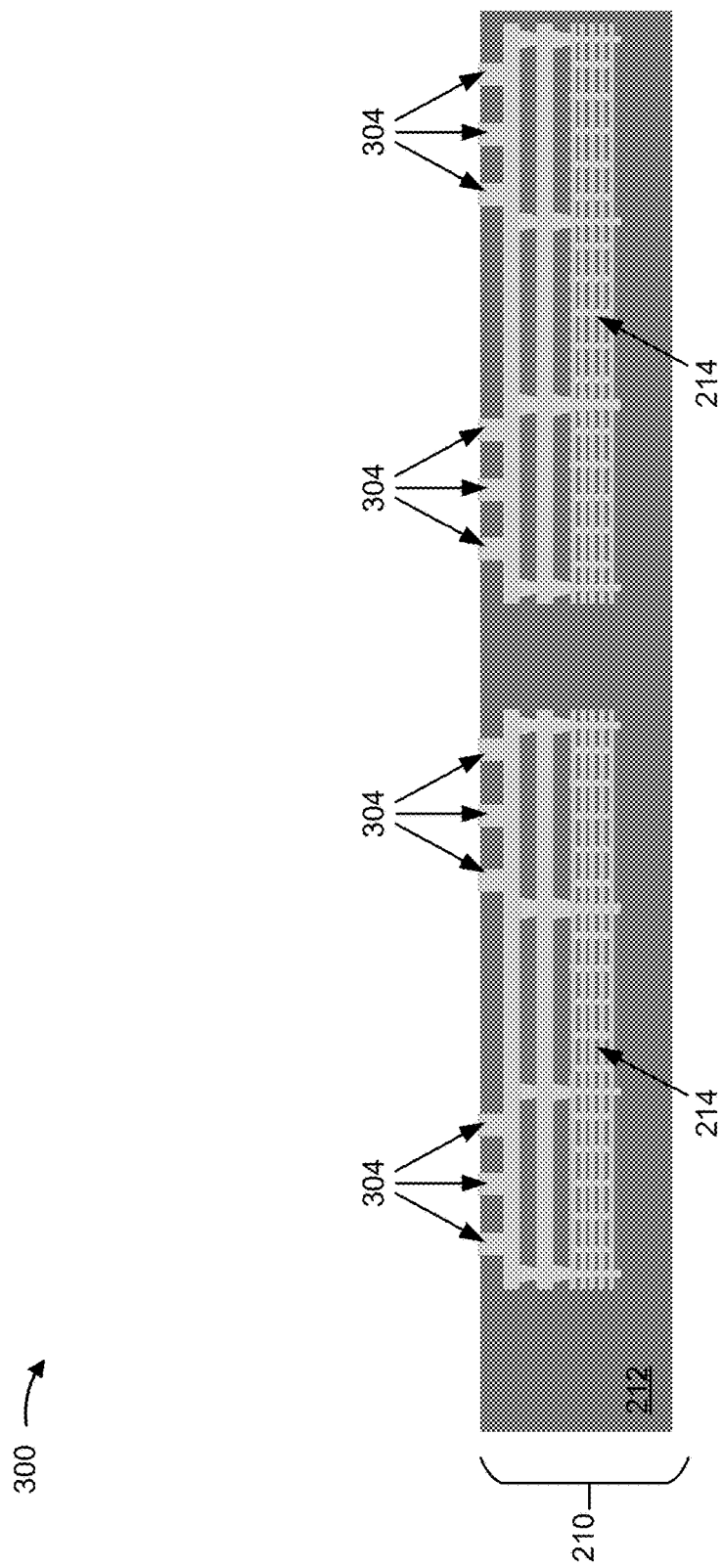

FIGS. 3A-3C are diagrams of an example implementation 300 described herein. Example implementation 300 may be an example process for forming the second wafer 210 of the semiconductor device 200. In some implementations, the second wafer 210 includes an ASIC or an SOC. The second wafer 210 may include one or more additional devices, structures, and/or layers not shown in FIGS. 3A-3C.

As shown in FIG. 3A, example implementation 300 may include forming one or more metal structures 214 and/or trench structures 208 within a body 212 of the second wafer 210. In some implementations, a deposition tool (e.g., deposition tool 102) deposits materials of the one or more metal structures 214 and/or materials of the one or more trench structures 208 within the body 212 of the second wafer 210. For example, the deposition tool may deposit the materials of the one or more metal structures 214 and/or the materials of the one or more trench structures 208 within recessed portions (e.g., formed based on an etching operation of an etching tool) of the body 212 of the second wafer 210. In some implementations, the deposition tool uses chemical vapor deposition or physical vapor deposition, among other examples, to deposit the materials of the one or more metal structures 214 and/or the materials of the one or more trench structures 208 within recessed portions of the body 212 of the second wafer 210. In some implementations, the deposition tool may deposit one or more layers of the body 212 of the second wafer 210 on and/or between elements of the one or more metal structures 214 and/or the one or more trench structures 208. For example, the deposition tool may deposit one or more dielectric layers on a top surface of the one or more metal structures 214.

In some implementations, a planarization tool (e.g., planarization tool 106) may polish and/or planarize the body 212 of the second wafer 210 (e.g., after forming the one or more metal structures 214 and/or after depositing one or more layers of the body 212) to form a generally planar top surface of the second wafer 210. In this way, the top surface of the second wafer 210 (e.g., the body 212) may be suitable for bonding to the first wafer 202).

As shown in FIG. 3B, example implementation 300 may include forming a set of recessed portions 302 in a top surface of the body 212 of the second wafer 210. In some implementations, an etching tool (e.g., etching tool 104) may etch one or more portions of the top surface of the body 212 of the second wafer 210 to form the set of recessed portions 302. In some implementations, the etching tool forms the set of recessed portions 302 to extend from the top surface of the body 212 of the second wafer 210 to the one or more metal structures 214.

As shown in FIG. 3C, example implementation 300 may include depositing a set of metal elements 304 within the set of recessed portions 302 of the second wafer 210. In some implementations, a deposition tool (e.g., deposition tool 102) deposits material of the set of metal elements 304 within the set of recessed portions 302. In some implementations, the deposition tool uses chemical vapor deposition, physical vapor deposition, and/or reflow, among other examples, to deposit the material of the set of metal elements 304 within the set of recessed portions 302 of the second wafer 210. In some implementations, the deposition tool deposits the set of metal elements 304 in multiple layers. For example, the deposition tool may deposit one or more seed layers (e.g., three seed layers) in a process for depositing the set of metal elements 304. In some implementations, the deposition tool may deposit one or more barrier layers and/or adhesion layers within the set of recessed portions 302 of the second wafer 210 to reduce electromigration of the set of metal elements 304 into the body 212 and/or to reduce peeling of the set of metal elements 304 from the body 212 and/or from the one or more metal structures 214.

As indicated above, FIGS. 3A-3C are provided as an example. Other examples may differ from what is described with regard to FIGS. 3A-3C.

Figure 4A:
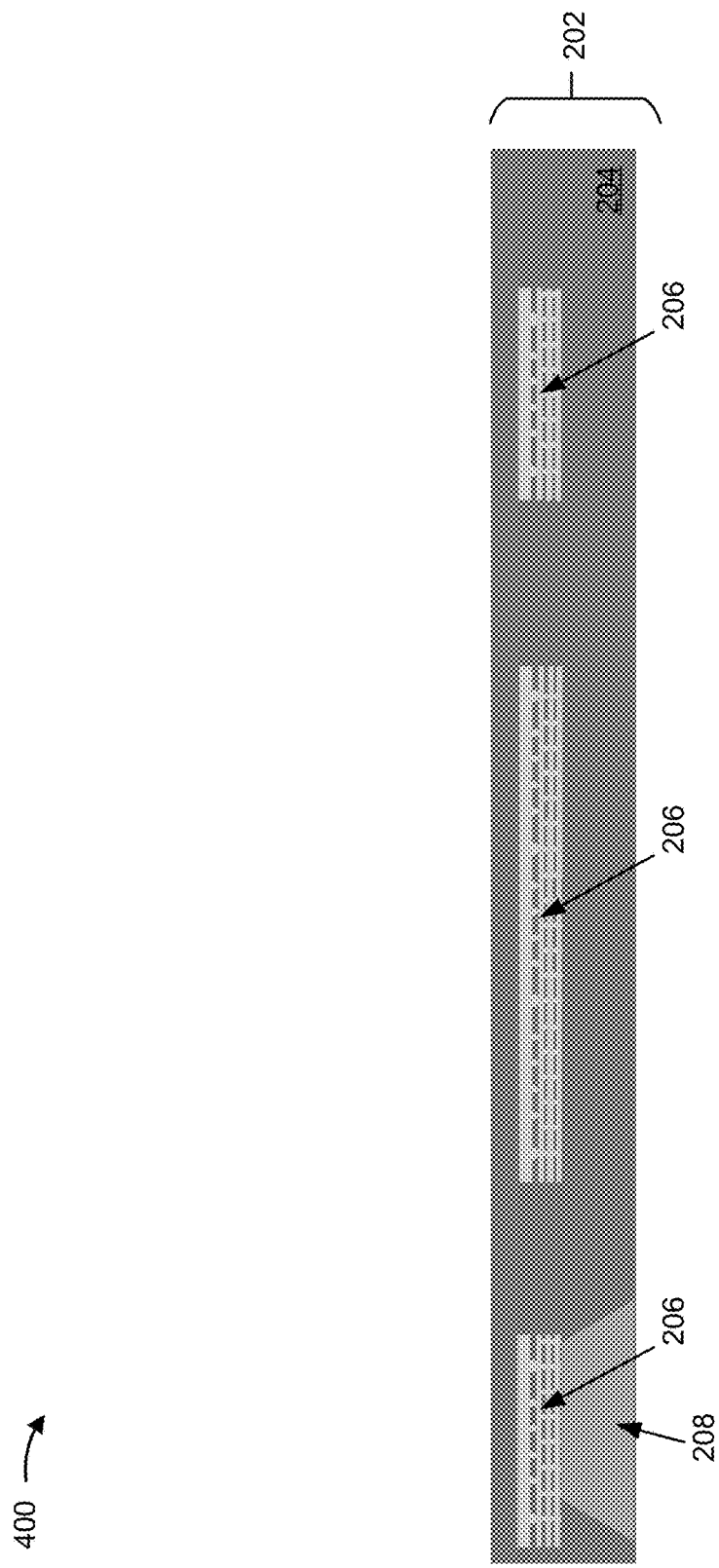
FIGS. 4A-4C are diagrams of an example implementation described herein.
Figure 4B:
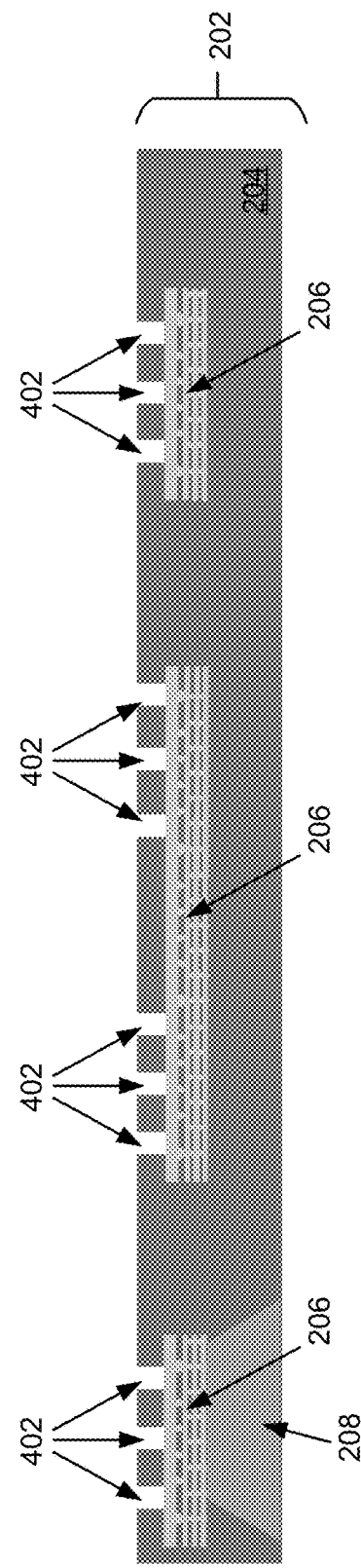
Figure 4C:
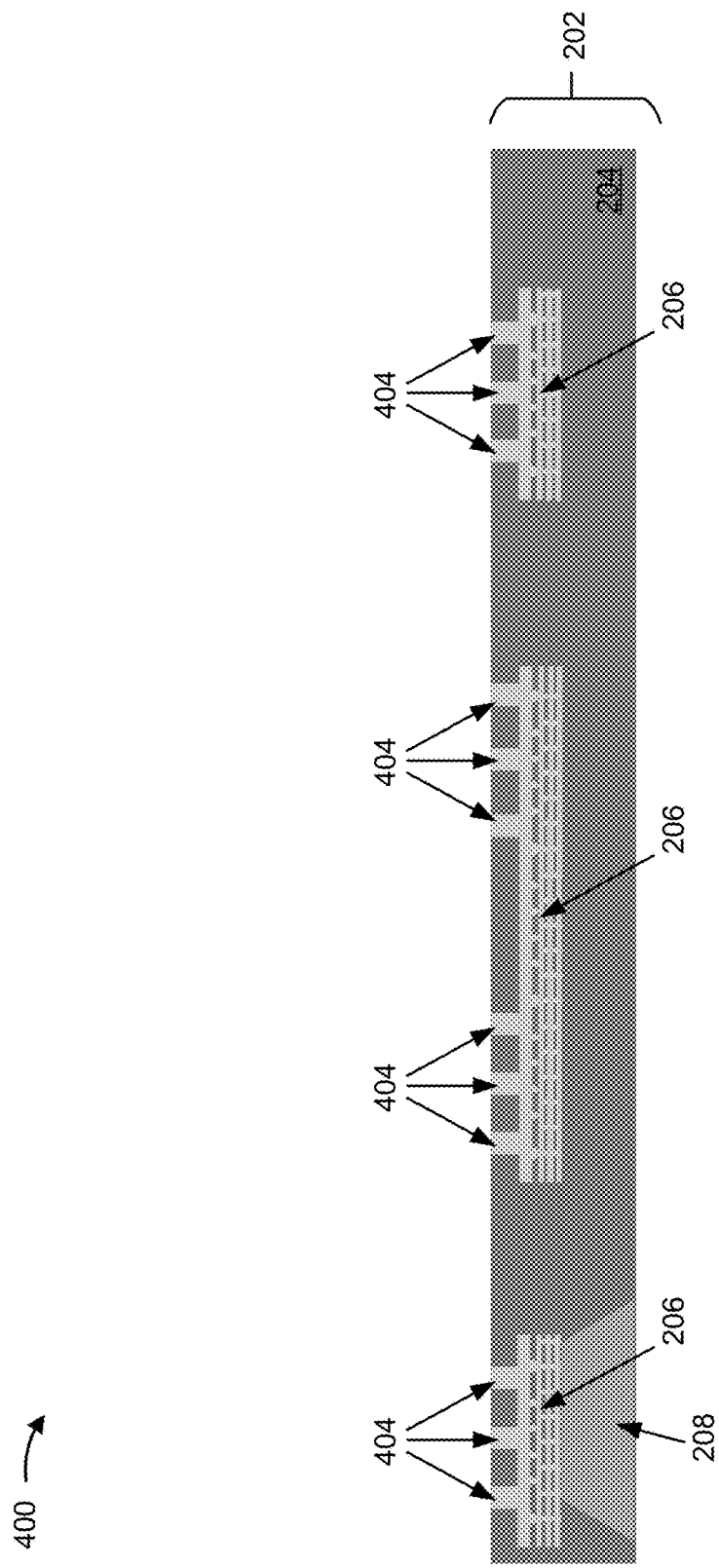

FIGS. 4A-4C are diagrams of an example implementation 400 described herein. Example implementation 400 may be an example process for forming the first wafer 202 of the semiconductor device 200. In some implementations, the first wafer 202 includes an SOC or an ASIC. The first wafer 202 may include one or more additional devices, structures, and/or layers not shown in FIGS. 4A-4C.

As shown in FIG. 4A, example implementation 400 may include forming one or more metal structures 206 and/or one or more trench structures 208 within a body 204 of the first wafer 202. In some implementations, a deposition tool (e.g., deposition tool 102) deposits materials of the one or more metal structures 206 and/or materials of the one or more trench structures 208 within the body 204 of the first wafer 202. For example, the deposition tool may deposit the materials of the one or more metal structures 206 and/or the materials of the one or more trench structures 208 within recessed portions (e.g., formed based on an etching operation of an etching tool) of the body 204 of the first wafer 202. In some implementations, the deposition tool uses chemical vapor deposition or physical vapor deposition, among other examples, to deposit the materials of the one or more metal structures 206 and/or the materials of the one or more trench structures 208 within recessed portions of the body 204 of the first wafer 202. In some implementations, the deposition tool may deposit one or more layers of the body 204 of the first wafer 202 on, and/or or between, elements of the one or more metal structures 206 and/or within the one or more trench structures 208. For example, the deposition tool may deposit one or more dielectric layers on a top surface of the one or more metal structures 206.

In some implementations, a planarization tool (e.g., planarization tool 106) may polish and/or planarize the body 204 of the first wafer 202 (e.g., after forming the one or more metal structures 206 and/or after depositing one or more layers of the body 204) to form a generally planar top surface of the first wafer 202. In this way, the top surface of the first wafer 202 (e.g., the body 204) may be suitable for bonding to the second wafer 210.

As shown in FIG. 4B, example implementation 400 may include forming a set of recessed portions 402 in a top surface of the body 204 of the first wafer 202. In some implementations, an etching tool (e.g., etching tool 104) may etch one or more portions of the top surface of the body 204 of the first wafer 202 to form the set of recessed portions 402. In some implementations, the etching tool forms the set of recessed portions 402 to extend from the top surface of the body 204 of the first wafer 202 to the one or more metal structures 206.

As shown in FIG. 4C, example implementation 400 may include depositing a set of metal elements 404 within the set of recessed portions 402 of first wafer 202. In some implementations, a deposition tool (e.g., deposition tool 102) deposits material of the set of metal elements 404 within the set of recessed portions 402. In some implementations, the deposition tool uses chemical vapor deposition, physical vapor deposition, and/or reflow, among other examples, to deposit the material of the set of metal elements 404 within the set of recessed portions 402 of the first wafer 202. In some implementations, the deposition tool deposits the set of metal elements 404 in multiple layers. For example, the deposition tool may deposit one or more seed layers (e.g., 3 seed layers) in a process for depositing the set of metal elements 404. In some implementations, the deposition tool may deposit one or more barrier layers and/or adhesion layers within the set of recessed portions 402 of the first wafer 202 to reduce electromigration of the set of metal elements 404 into the body 204 and/or to reduce peeling of the set of metal elements 404 from the body 204 and/or from the one or more metal structures 206.

In some implementations, the set of metal elements 404 may be formed of a same material as the set of metal elements 304 (shown in FIG. 3C). For example, the set of metal elements 404 and the set of metal elements 304 may be formed of a copper-based material, a tungsten-based material, or a titanium-based material, among other examples.

As indicated above, FIGS. 4A-4C are provided as an example. Other examples may differ from what is described with regard to FIGS. 4A-4C. In some implementations, example implementation 400 may be a same process as example implementation 300. In some implementations, example implementation 400 may differ from example 300 based on differences between the one or more metal structures 206 and the one or more metal structures 214. Additionally, or alternatively, example implementation 400 may include forming an ASIC on the first wafer 202 and example implementation 300 may include forming an SOC on the second wafer 210, or vice versa.

Figure 5A:
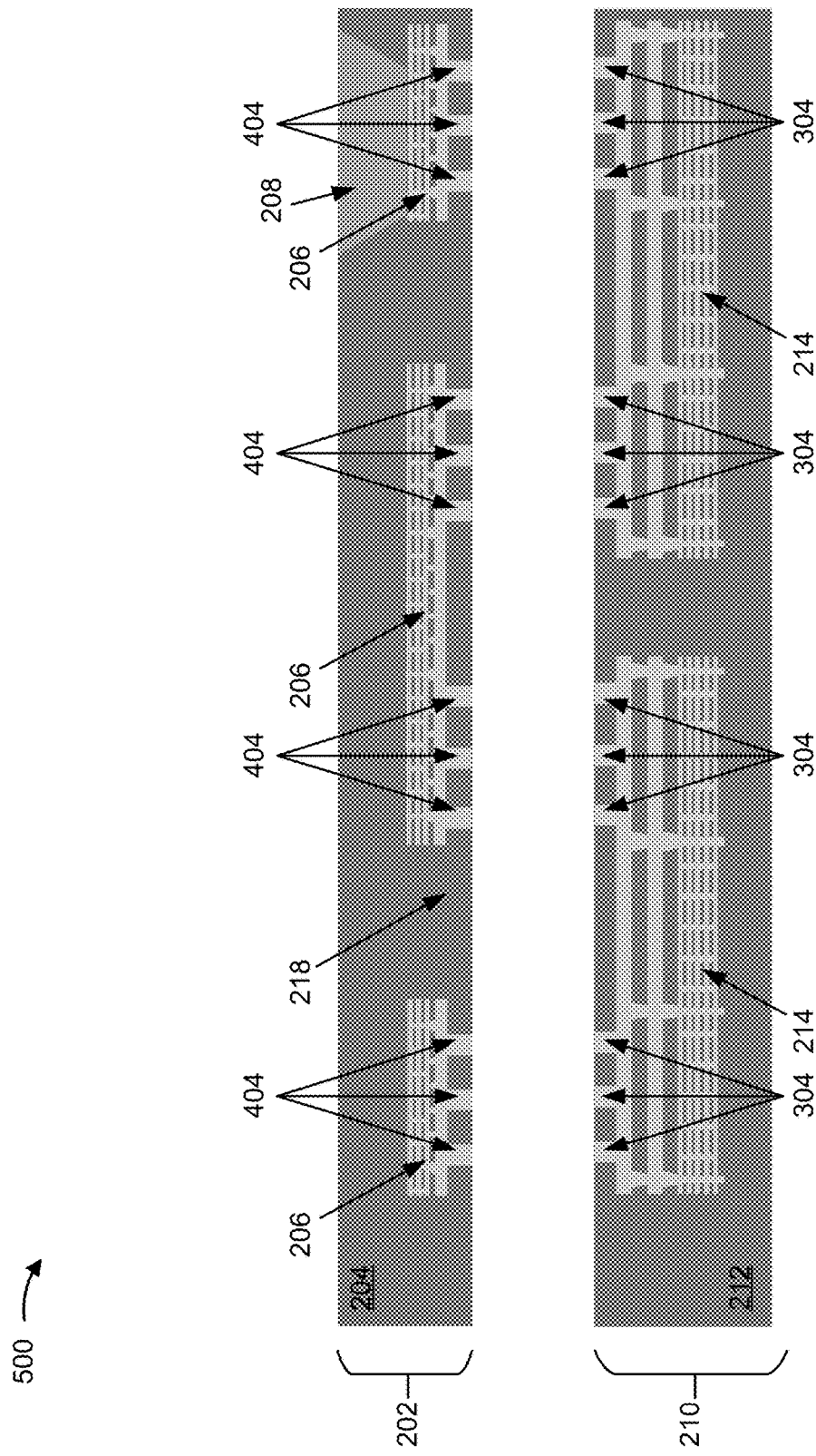
FIGS. 5A-5C are diagrams of an example implementation described herein.
Figure 5B:
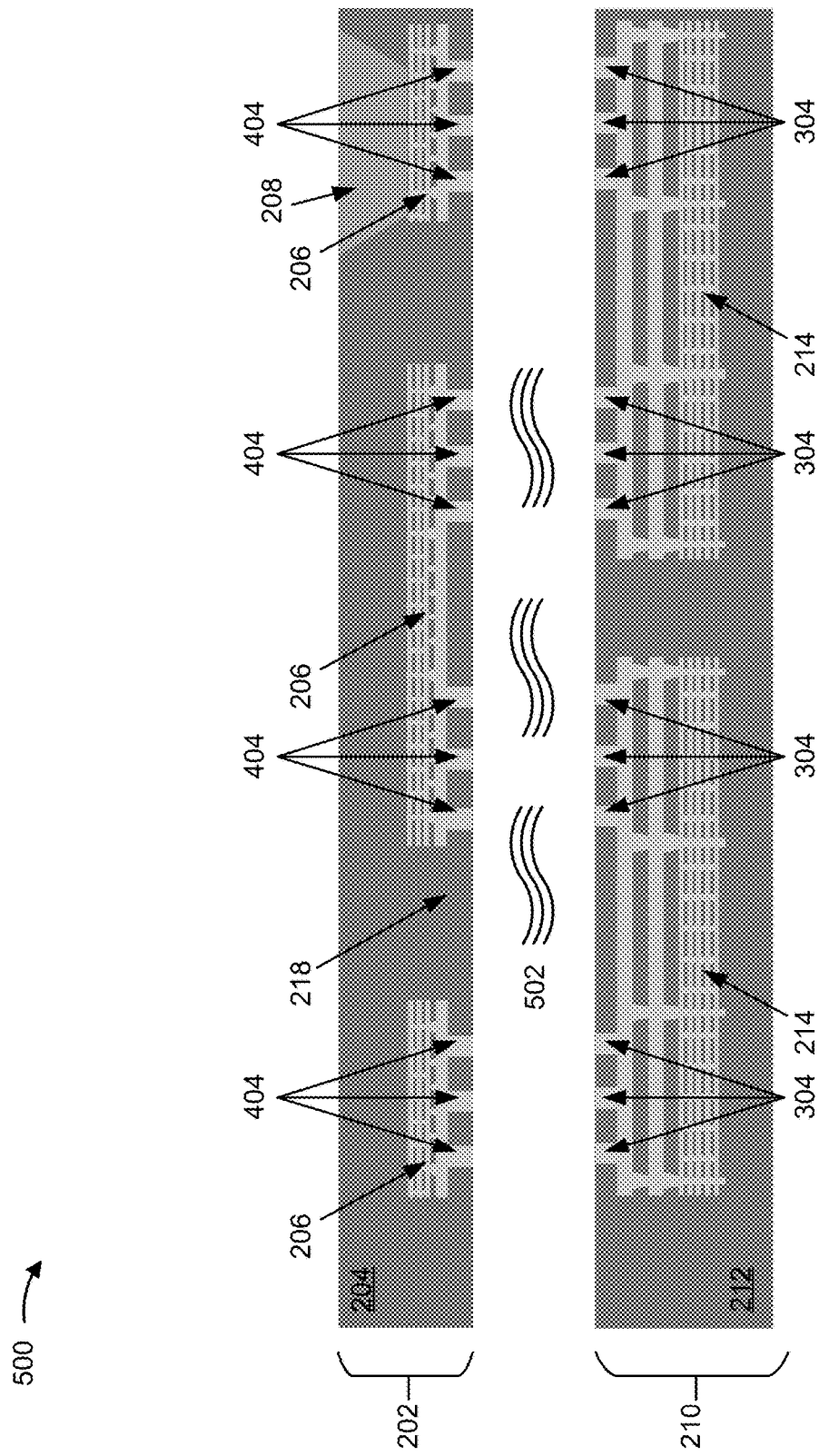
Figure 5C:
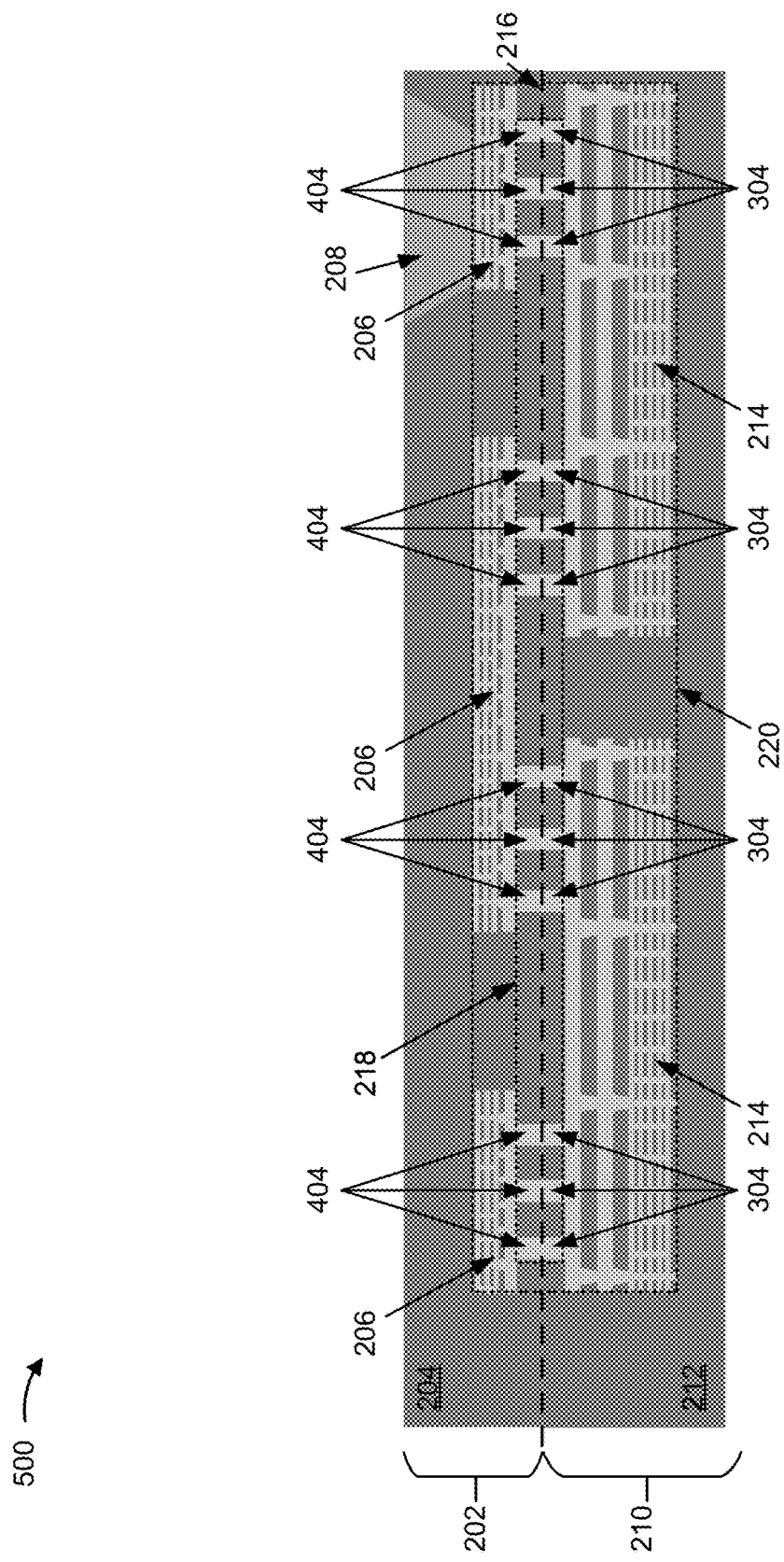

FIGS. 5A-5C are diagrams of an example implementation 500 described herein. Example implementation 500 may be an example process for bonding the first wafer 202 to the second wafer 210 to form the semiconductor device 200. In some implementations, the first wafer 202 and/or the second wafer 210 includes an SOC. Additionally, or alternatively, the first wafer 202 and/or the second wafer 210 includes an ASIC. The first wafer 202 and/or the second wafer 210 may include one or more additional devices, structures, and/or layers not shown in FIGS. 5A-5C.

As shown in FIG. 5A, the first wafer 202 is flipped such that a surface shown as a top surface of the first wafer 202 in FIGS. 3A-3C is now shown as a bottom surface of the first wafer 202 in FIG. 5A. In some implementations, a wafer/die transport tool (e.g., wafer/die transport tool 110) flips the first wafer 202. In some implementations, the wafer/die transport tool positions the set of metal elements 404 to be proximate to and/or aligned with the set of metal elements 304 (e.g., such that the set of metal elements 404 at least partially overlap the set of metal elements 304). Alternatively, the wafer/die transport tool may flip the second wafer 210 to position the set of metal elements 304 to be proximate to and/or aligned with the set of metal elements 404 (e.g., such that the set of metal elements 304 at least partially overlap the set of metal elements 404).

As shown in FIG. 5B, heat 502 may be applied to the bottom surface of the first wafer 202 and/or to the top surface of the second wafer 210. In some implementations, a bonding tool (e.g., bonding tool 108) applies heat 502 to the bottom surface of the first wafer 202 and/or to the top surface of the second wafer 210. The bonding tool may apply the heat 502 at a temperature within a range of approximately 100 degrees Celsius to approximately 300 degrees Celsius. For example, the temperature may be associated with a melting temperature of the material of the set of metal elements 304 and/or the set of metal elements 404. In this way, a bonding layer (e.g., of oxide-based material) of the first wafer 202 may bond with a bonding layer of the second wafer 210. Additionally, or alternatively, the set of metal elements 304 may form a bond (e.g., a covalent bond) with the set of metal elements 404 with a lower amount of heat 502 than a bond that is formed using only bonding layers of the dielectric materials. This may conserve energy resources associated with manufacturing a semiconductor device (e.g., semiconductor device 200) that includes the first wafer 202 and the second wafer 210).

As shown in FIG. 5C, the first wafer 202 may bond to the second wafer 210 based on the bottom surface of the first wafer 202 contacting the top surface of the second wafer 210. For example, the first wafer 202 may bond to the second wafer 210 based on heat and/or pressure applied to the bottom surface of the first wafer 202 and the top surface of the second wafer 210. In some implementations, a bonding tool (e.g., bonding tool 108) and/or a wafer/die transport tool (e.g., wafer/die transport tool 110) may position the first wafer 202 into contact with the second wafer 210. As shown, the one or more metal structures 206, the one or more metal structures 214, the set of metal elements 304, and the set of metal elements 404 may be arranged to form the daisy chain seal ring structure 220.

As noted in FIG. 5C, the set of metal elements 304 and the set of metal elements 404 may bond together to form a metal bonding structure 218. The metal bonding structure 218 includes one or more pairs of metal elements 304/404 that extend from the one or more metal structures 206 to the one or more metal structures 214 through the interface 216 to from the daisy chain seal ring structure 220. Based on the one or more pairs of metal elements 304/404 extending between, and coupling, the one or more metal structure 206 and the one or more metal structures 214, a bond between the first wafer 202 and the second wafer 210 may be improved. For example, the bond may cause a reduced lateral shifting between the first wafer 202 and the second wafer 210, which may reduce a likelihood of cracking between the first wafer 202 and the second wafer 210.

As indicated above, FIGS. 5A-5C are provided as an example. Other examples may differ from what is described with regard to FIGS. 5A-5C.

FIGS. 6A-6F are diagrams of example semiconductor devices 200 described herein. The example semiconductor devices 200 may include additions or alternatives to trench structure 208 and/or the metal bonding structure 218 shown in any of FIGS. 2-5C. The described additions or alternatives may be included in the first wafer 202 and/or the second wafer 210 of the semiconductor device 200 and may replace, or may be in addition to, corresponding elements described in connection with FIGS. 2-5C. The additions or alternatives may simplify a manufacturing process by accounting for different shapes and non-aligned trench elements among the first wafer 202 and the second wafer 210.

Figure 6A:
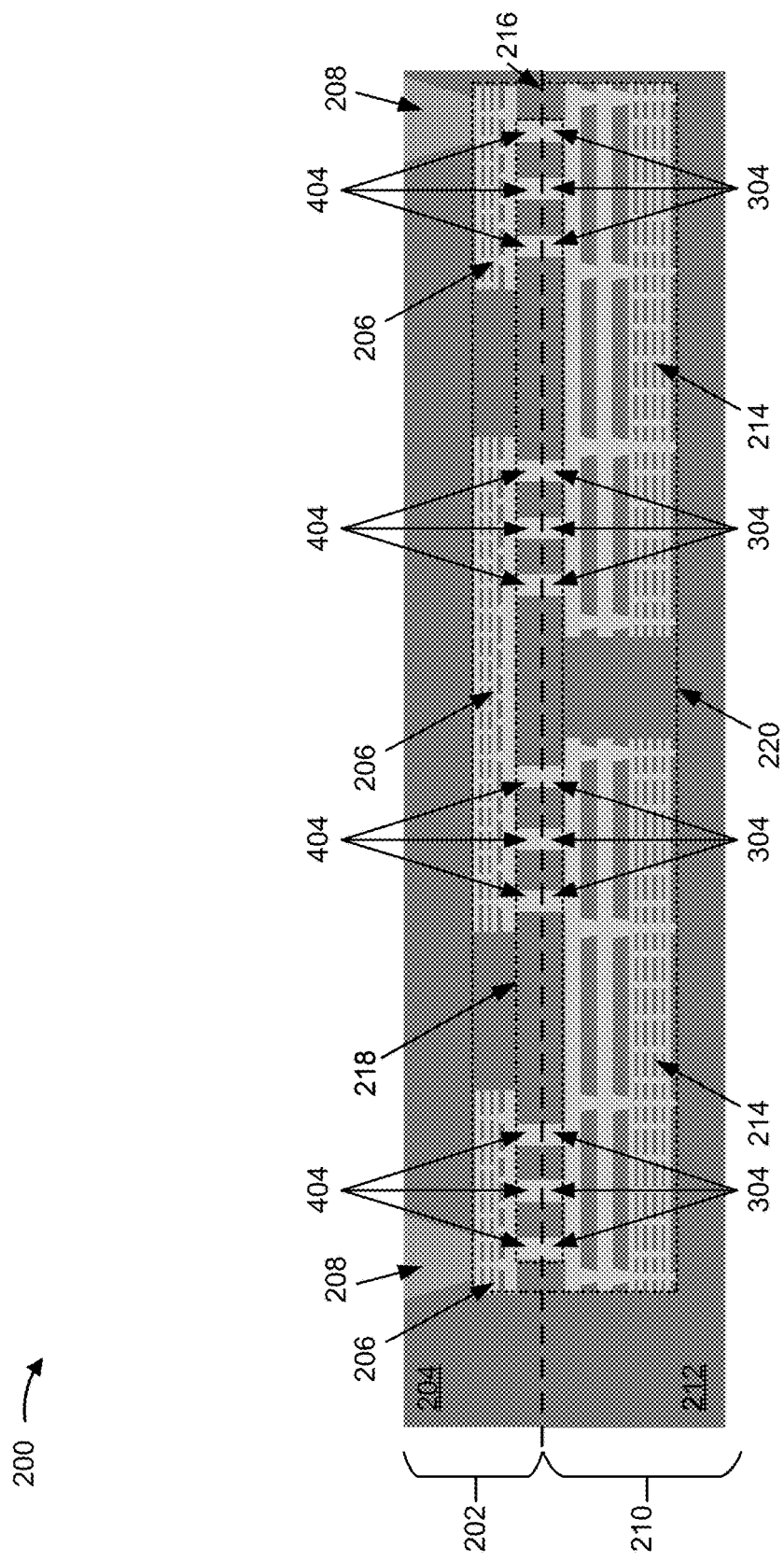
FIGS. 6A-6F are diagrams of example semiconductor structures described herein.
Figure 6B:
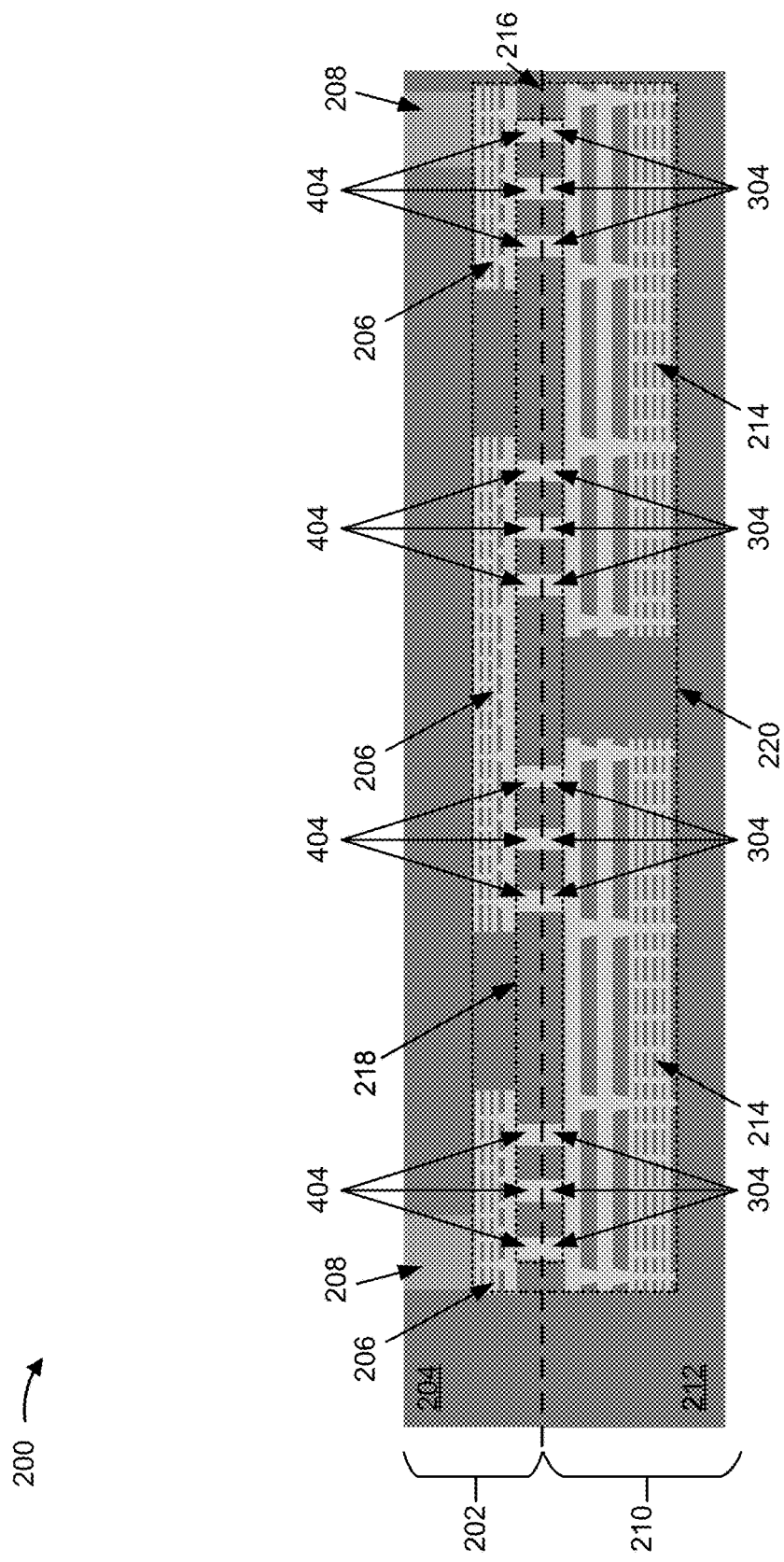

FIGS. 6A and 6B are example implementations of the semiconductor device 200 in which the semiconductor device 200 includes a first trench structure 208 over a first metal structure 206 of the daisy chain seal ring structure 220 and a second trench structure 208 over a second metal structure 206 of the daisy chain seal ring structure 220. In the example shown in FIG. 6A, the first and second trench structures 208 have sloped side-surfaces (e.g., cross-sections of the first and second trench structures 208 have a trapezoidal shape). In the example shown in FIG. 6B, the first and second trench structures 208 have side-surfaces that are non-sloped (e.g., cross-sections of the first and second trench structures 208 have a rectangular shape). Notably, the shape of the first and second trench structures 208 need only enable corresponding portions of the surfaces of the metal structures 206 to be exposed and, therefore, trench structures 208 having other shapes can be utilized. In some implementations, formation of the first and second trench structures 208 in a single wafer of the semiconductor device 200 (e.g., the first wafer 202) simplifies manufacturing of the semiconductor device 200. For example, the first and second trench structures 208 can be formed concurrently in a single semiconductor processing step (e.g., along with one or more other trench structures of the semiconductor devices 200 not shown in FIGS. 6A and 6B), thereby simplifying manufacture of the semiconductor device 200 while enabling utilization of a test pattern incorporated in the daisy chain seal ring structure 220. Further, in such an implementation, no trench structures 208 are formed in the second wafer 210, thereby further simplifying manufacture of the semiconductor device 200 while enabling utilization of a test pattern incorporated in the daisy chain seal ring structure 220. Additionally, formation of the first and second trench structures 208 in a single wafer of the semiconductor device 200 may simplify performance of a testing process by, for example, enabling an input signal to be provided and an output signal to be received on a same side of the semiconductor device 200 (e.g., the top side of the semiconductor devices 200 shown in FIGS. 6A and 6B).

Figure 6C:
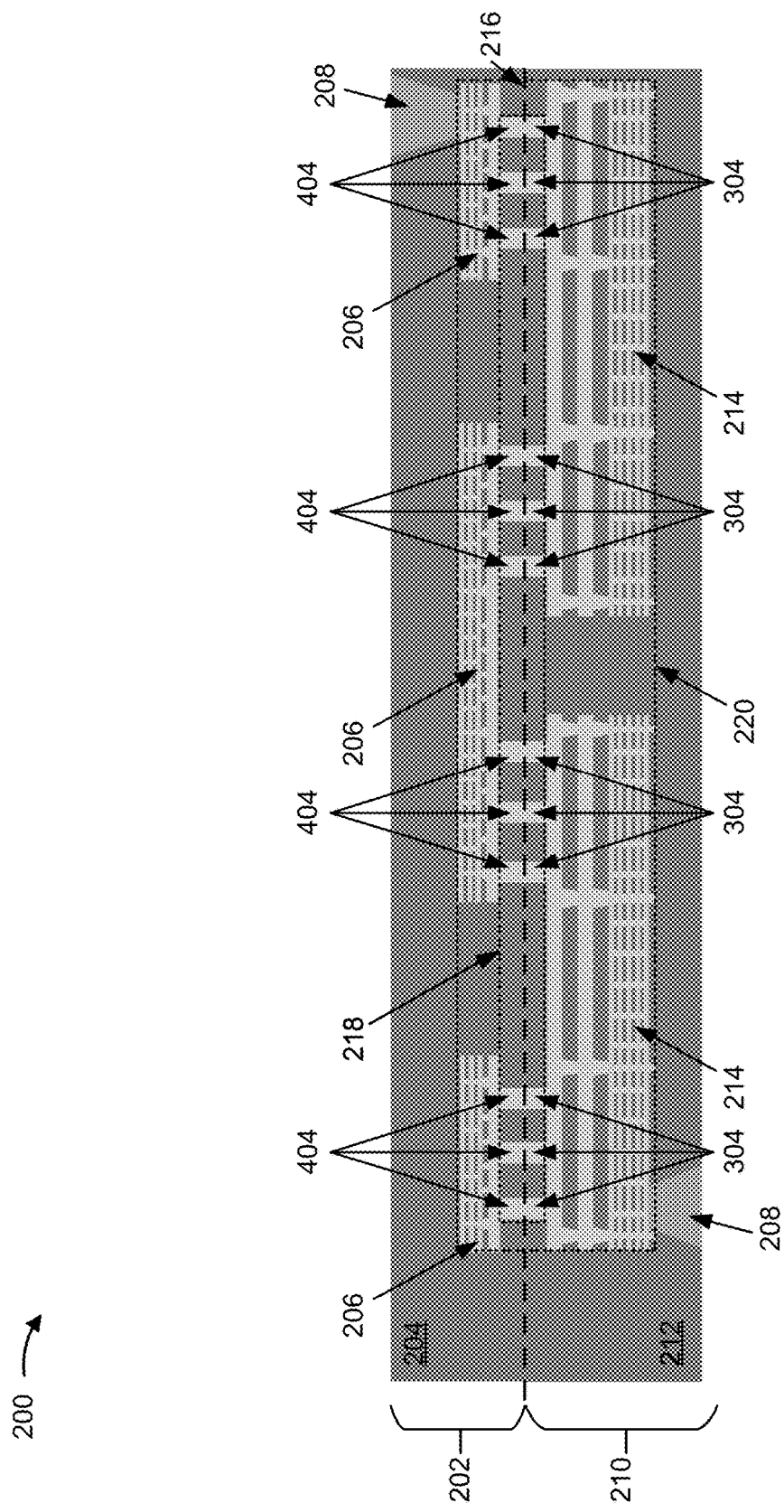
Figure 6D:
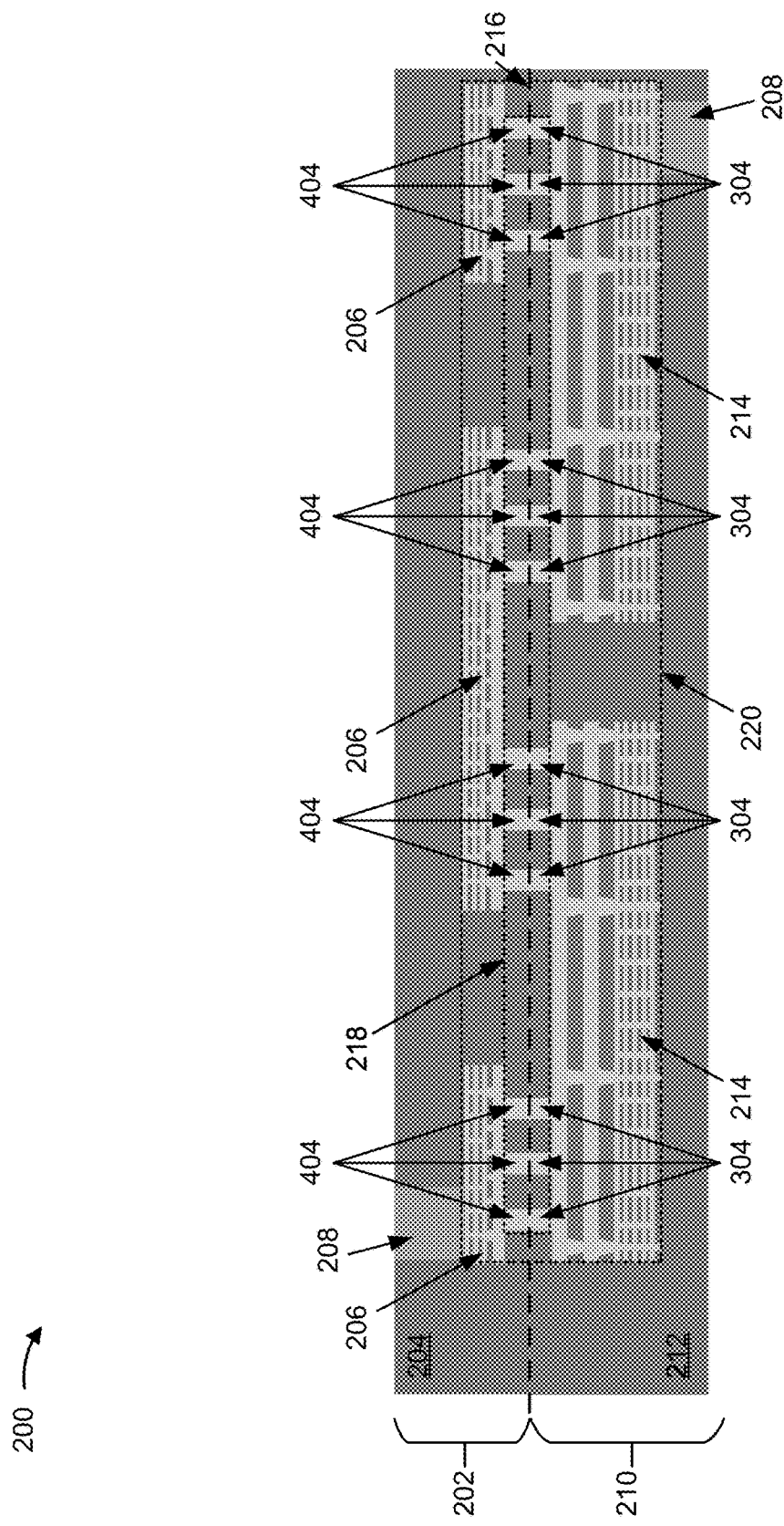

FIGS. 6C and 6D are example implementations of the semiconductor device 200 in which the semiconductor device 200 includes a first trench structure 208 over a metal structure 206 of the daisy chain seal ring structure 220 and a second trench structure 208 under a metal structure 214 of the daisy chain seal ring structure 220. In the example shown in FIG. 6C, the first and second trench structures 208 have sloped side-surfaces (e.g., cross-sections of the first and second trench structures 208 have a trapezoidal shape). In the example shown in FIG. 6D, the first and second trench structures 208 have side-surfaces that are non-sloped (e.g., cross-sections of the first and second trench structures 208 have a rectangular shape). Notably, the shape of the first and second trench structures 208 need only enable corresponding portions of the surfaces of the metal structures 206 to be exposed and, therefore, trench structures 208 having other shapes can be utilized. In some implementations, formation of the first and second trench structures 208 in different wafers of the semiconductor device 200 (e.g., the first wafer 202 and the second wafer 210) simplifies manufacturing of the semiconductor device 200. For example, a given trench structure 208 can be formed concurrently with one or more other trench structures of the semiconductor device 200 (not shown in FIG. 6C or 6D) while adding only a single trench structure to an etch pattern used in association with forming the one or more other trench structures. Additionally, formation of the first and second trench structures 208 in different wafers of the semiconductor device 200 enables flexibility in the design of test patterns that can be incorporated in the daisy chain seal ring structure 220 for utilization in performing of a testing process (e.g., the test pattern need not extend all the way through the daisy chain seal ring structure 220).

Figure 6E:
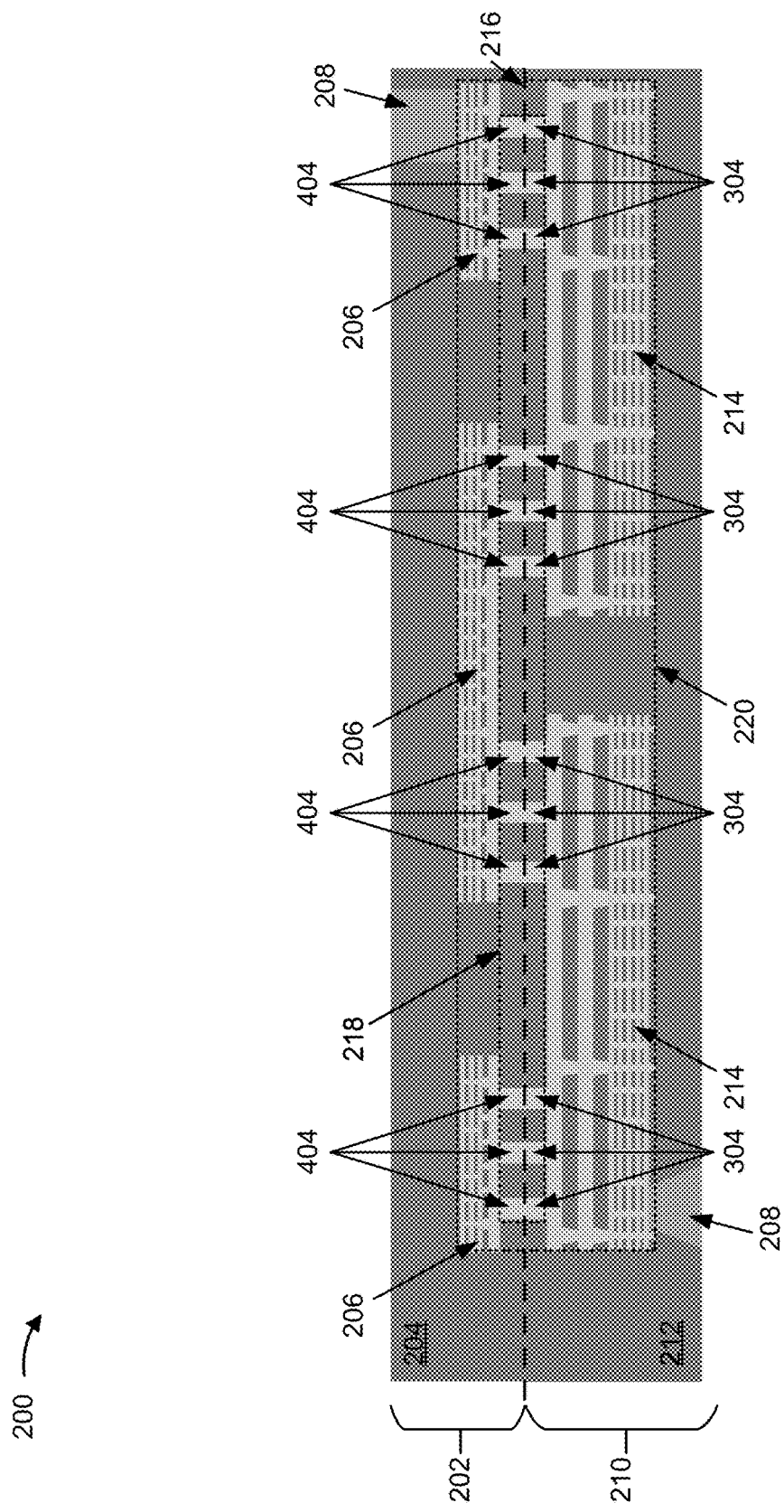
Figure 6F:
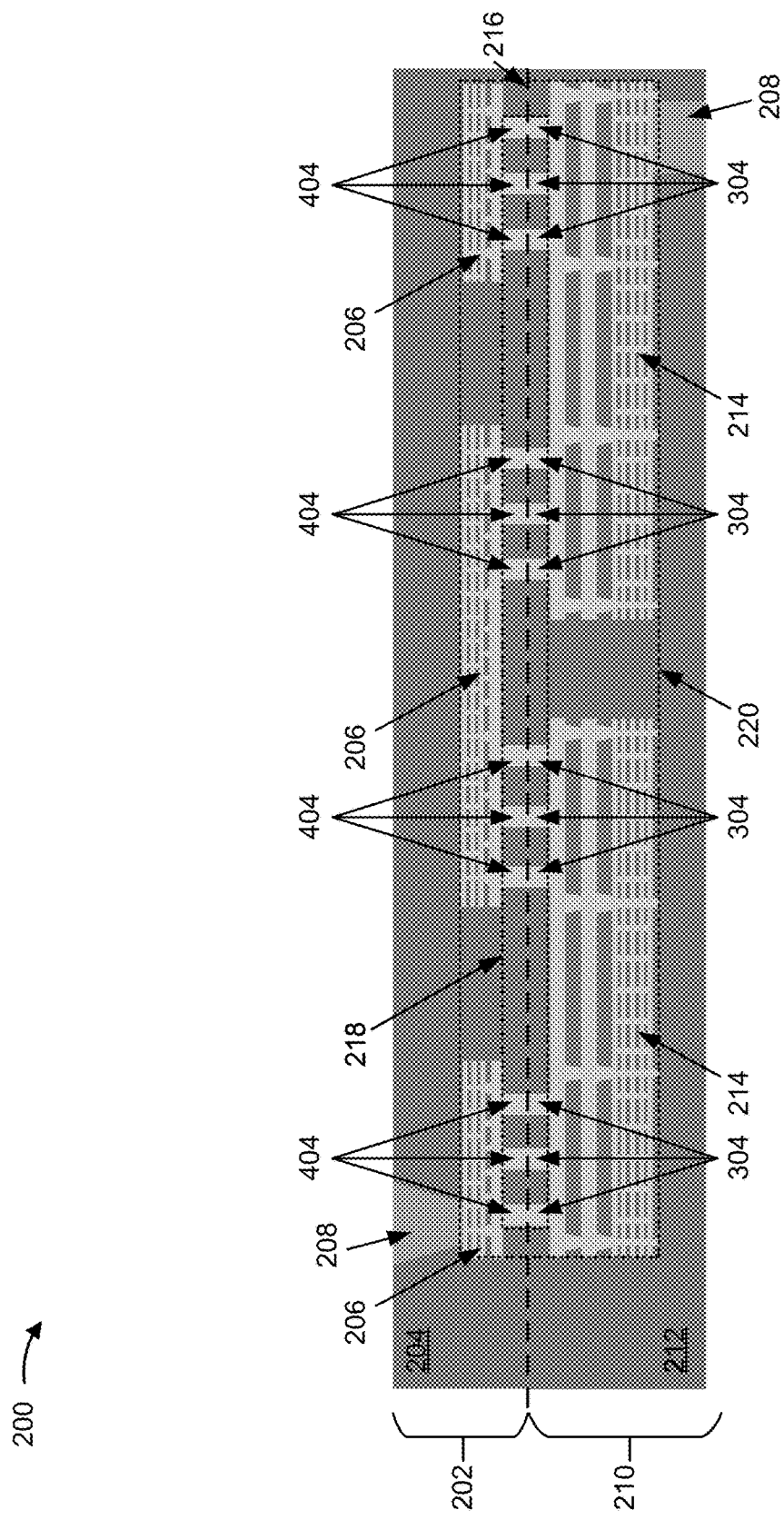

FIGS. 6E and 6F are example implementations of the semiconductor device 200 in which the semiconductor device 200 includes a first trench structure 208 over a metal structure 206 of the daisy chain seal ring structure 220 and a second trench structure 208 under a metal structure 214 of the daisy chain seal ring structure 220, where the first and second trench structures 208 have different shapes. In the example shown in FIG. 6E, the first trench structure 208 in the first wafer 202 has non-sloped side-surfaces and the second trench structure 208 in the second wafer 210 has sloped side-surfaces. In the example shown in FIG. 6F, the first trench structure 208 in the first wafer 202 has sloped side-surfaces and the second trench structure 208 in the second wafer 210 has non-sloped side-surfaces. Notably, the shape of the first and second trench structures 208 need only enable corresponding portions of the surfaces of the metal structures 206 to be exposed and, therefore, trench structures 208 having other shapes can be utilized. In some implementations, the use of different side-surface configurations or trench shapes for the first and second trench structures 208 allows for different etch recipes or different etch processes to be used to form the first and second trench structures 208, which can simplify formation of the first and second trench structures 208 (e.g., by enabling a given trench structure 208 in a given wafer to be formed concurrently with formation of other trench structures on the wafer and/or enabling different trench structures 208 to be formed at different times, using different processes, using different etch recipes, or the like).

As indicated above, FIGS. 6A-6F are provided as examples. Other examples may differ from what is described with regard to FIGS. 6A-6F.

FIGS. 7A-7I are diagrams of example semiconductor devices 200 described herein. The example semiconductor devices 200 may include additions or alternatives to the set of metal elements 304, the set of metal elements 404, and/or the metal bonding structure 218 shown in any of FIGS. 2-6F. The described additions or alternatives may be included in the first wafer 202 and/or the second wafer 210 and may replace, or may be in addition to, corresponding elements described in connection with FIGS. 2-6F. The example semiconductor devices 200 shown in FIGS. 7A-7I may include a bond region (e.g., a hybrid bonding region) in which the set of metal elements 304 and the set of metal elements 404 bond to form the metal bonding structure 218, and in which dielectric materials of the body 204 bond with dielectric materials of the body 212. The additions or alternatives may simplify a manufacturing process by accounting for different shapes and non-aligned metal elements to bond the first wafer 202 to the second wafer 210. Further, the additions or alternatives may improve manufacturing yield since comparatively more semiconductor devices 200 would be deemed acceptable due to a higher manufacturing tolerance that can be enabled by various implementations of the metal bonding structure 218 described below.

Figure 7A:
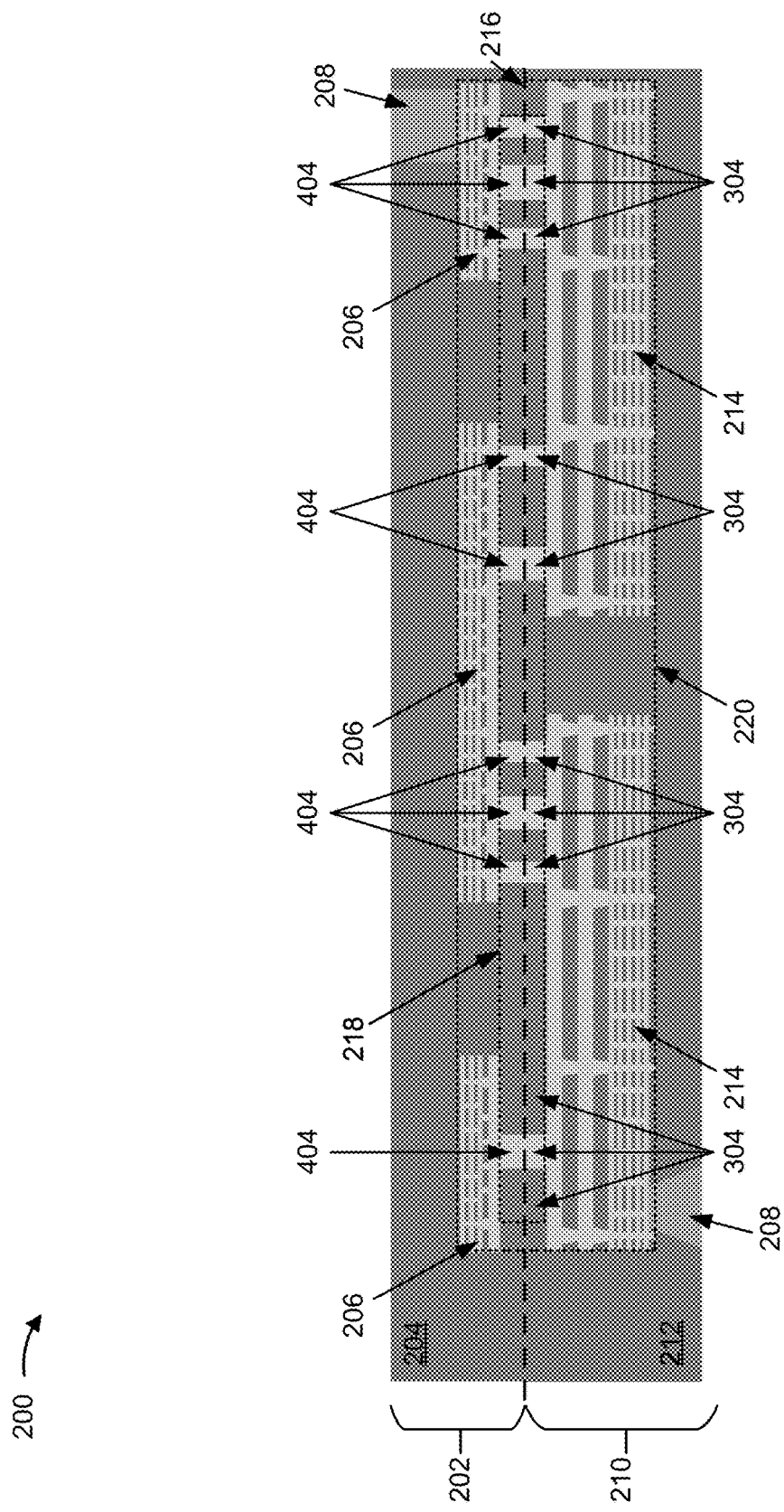
FIGS. 7A-7I are diagrams of example semiconductor structures described herein.

As shown in FIG. 7A, one or more of the set of metal elements 304 or the set of metal elements 404 of the metal bonding structure 218 may have a different quantity of metal elements and/or metal elements of different widths than shown in the example implementation of the semiconductor device 200 shown in FIG. 2. For example, a set of metal elements 304 and a set of metal elements 404 between the left metal structure 206 and the left metal structure 214 may include a single comparatively wider metal element (rather than three comparatively narrower metal elements, as shown in FIG. 2). As another example, a set of metal elements 304 and a set of metal elements 404 between the center metal structure 206 and the left metal structure 214 may include three metal elements, one of which is a comparatively wider metal element. As another example, a set of metal elements 304 and a set of metal elements 404 between the center metal structure 206 and the right metal structure 214 may include two metal elements, one of which is a comparatively wider metal element. As another example, a set of metal elements 304 and a set of metal elements 404 between the right metal structure 206 and the right metal structure 214 may include three metal elements, one of which is a comparatively wider metal element.

Figure 7B:
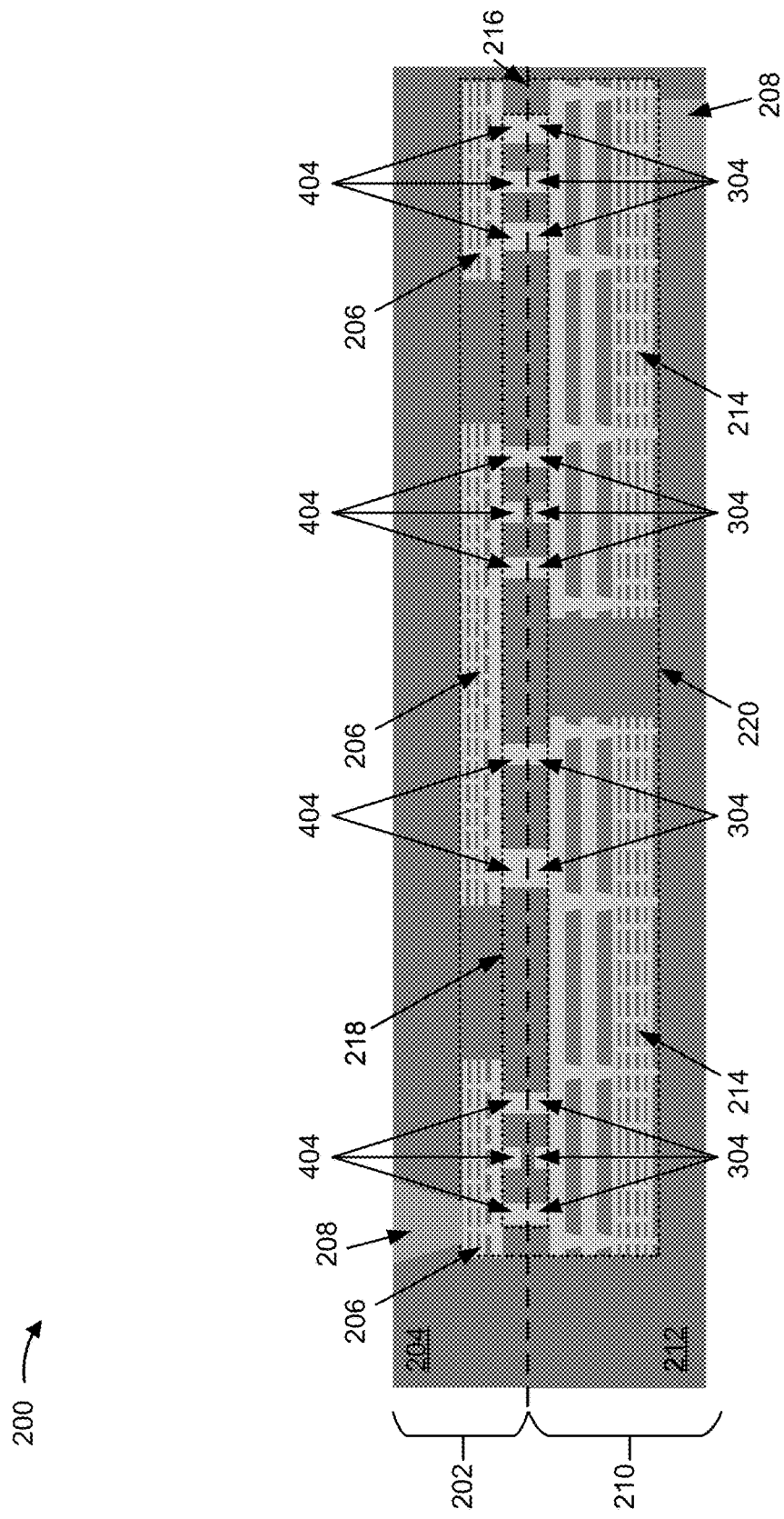

As shown in FIG. 7B, in some implementations, a first subset of a given set of metal elements 304 may bond to a first subset of a corresponding set of metal elements 404 and a second subset of the set of metal elements 304 may be separated from (e.g., not bonded to) a second subset of the set of metal elements 404. For example, in a portion of the metal bonding structure 218 between the left metal structure 206 and the left metal structure 214, the set of metal elements 404 may include at least one metal element 404 that is not bonded to any metal element of the set of metal elements 304. Notably, in FIG. 7B, metal elements 404 that are not bonded to any metal element 304 are non-consecutive metal elements 404. In this way, even if the metal bonding structure 218 includes at least one metal element 404 that is not bonded to any metal element of the set of metal elements 304, the metal bonding structure 218 may provide structural support across the interface 216 without localized weaknesses.

Figure 7C:
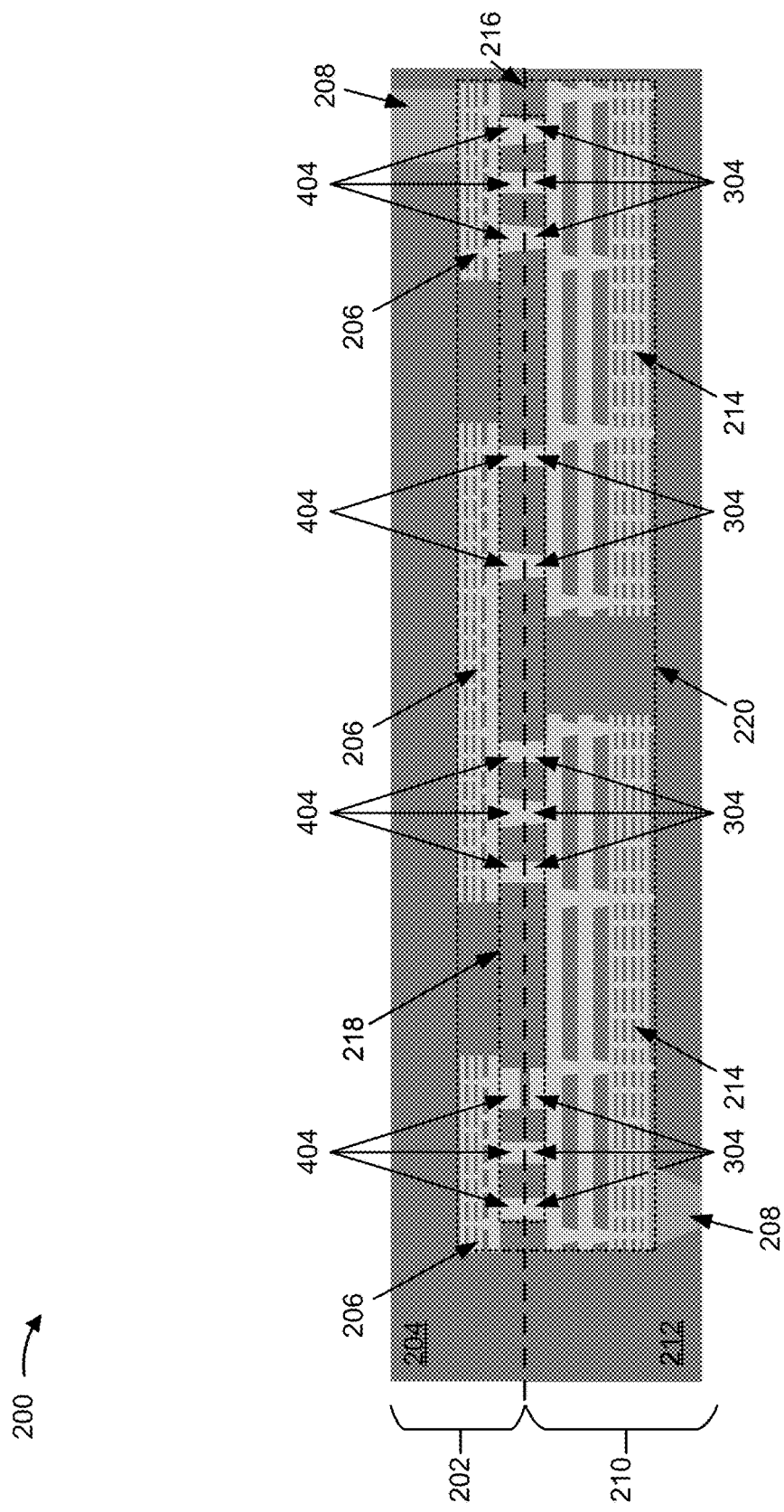

As shown in FIG. 7C, one or more of the set of metal elements 404 and/or one or more of the set of metal elements 304 may have a sloped side-surface. For example, the one or more of the set of metal elements 404 and/or the one or more of the set of metal elements 304 may have a trapezoidal-shaped cross-section. As also shown in FIG. 7C, one or more of the set of metal elements 404 may have different shapes from one or more others of the set of metal elements 404. Similarly, one or more of the set of metal elements 304 may have different shapes from one or more others of the set of metal elements 304. As also shown in FIG. 7C, the set of metal elements 404 may have metal elements having different shapes and/or different widths from one or more others of the set of metal elements 404. Similarly, the set of metal elements 304 may have metal elements having different shapes and/or different widths from one or more others of the set of metal elements 304.

Figure 7D:
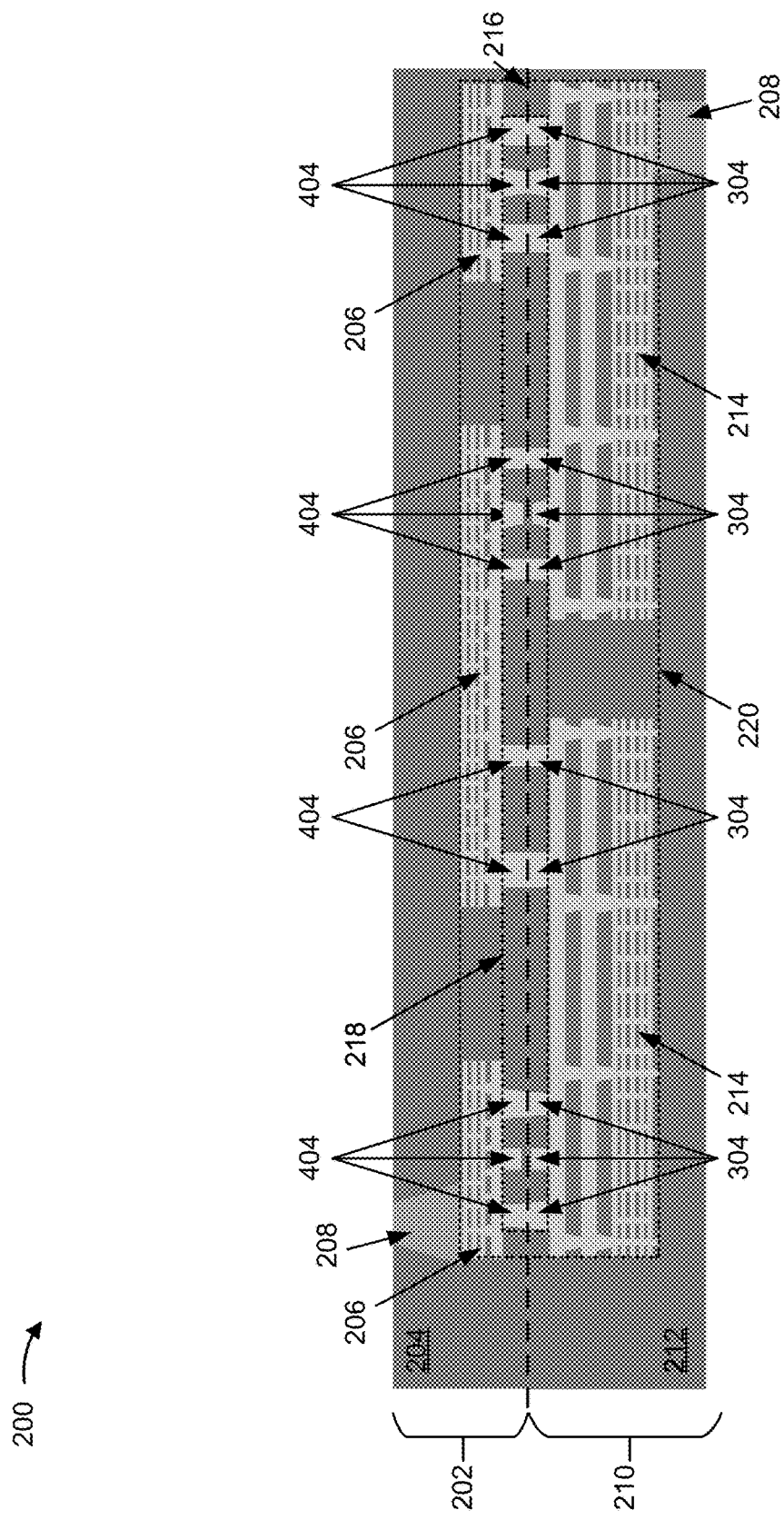
Figure 7E:
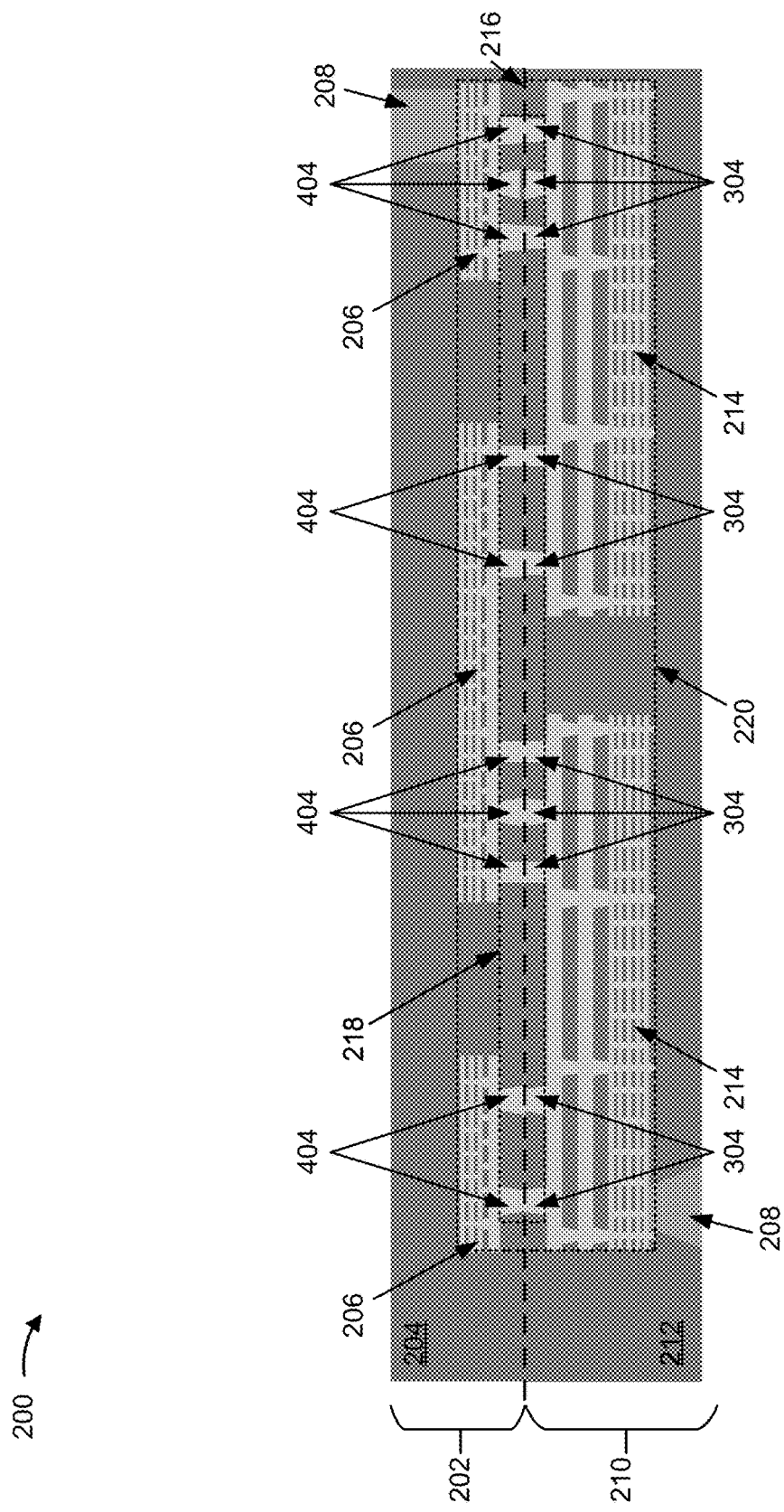
Figure 7F:
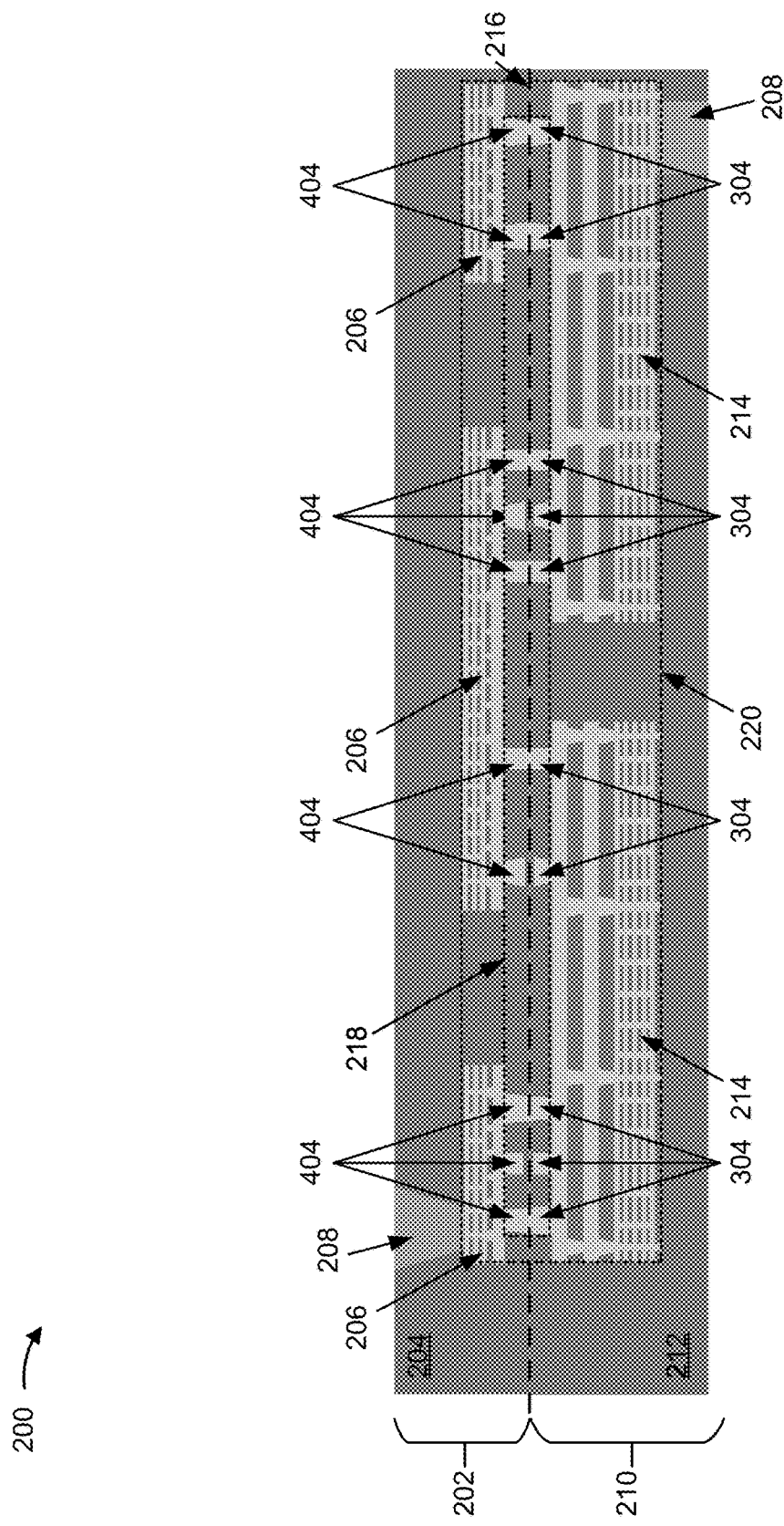
Figure 7G:
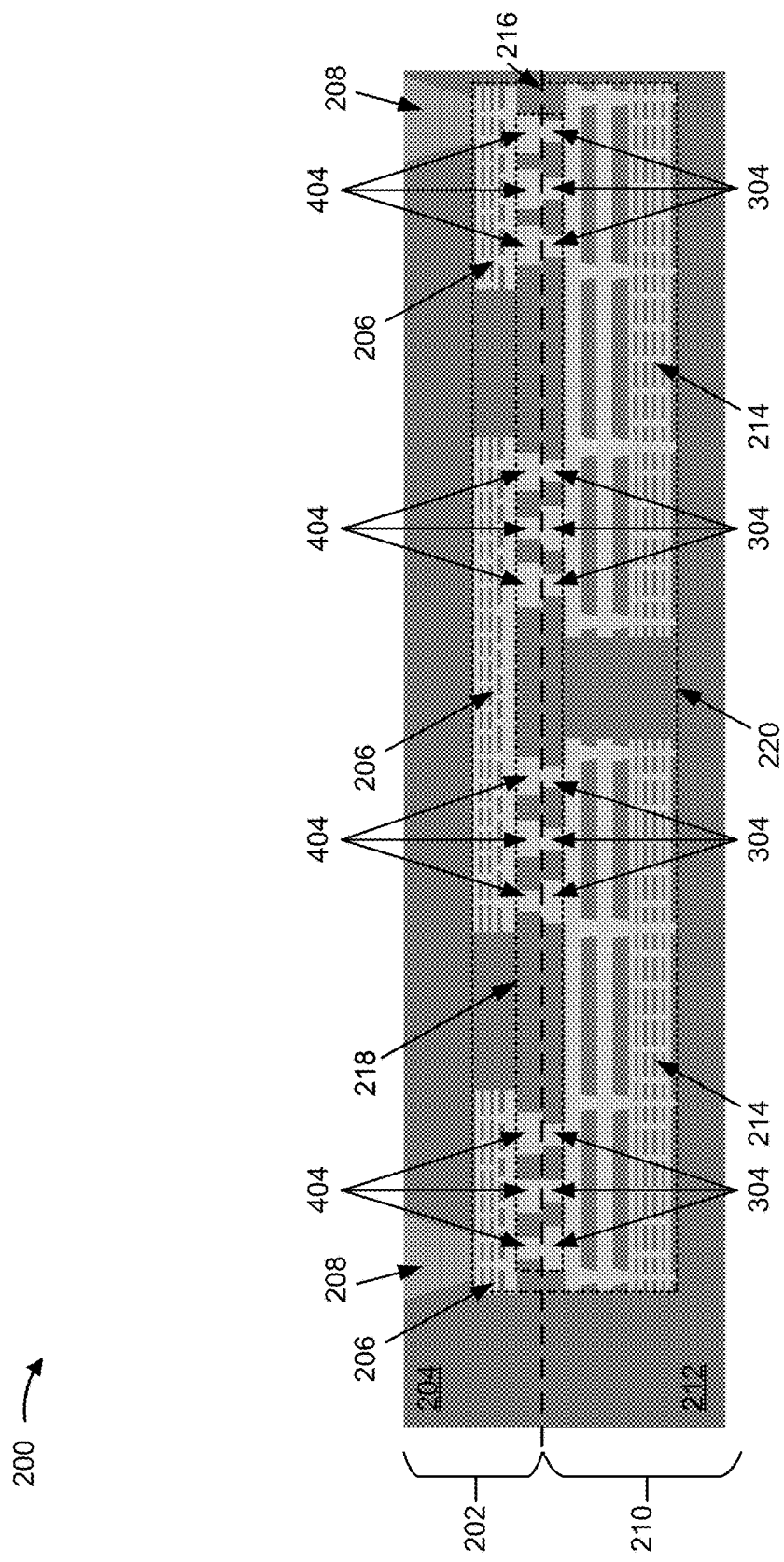

FIGS. 7D-7F illustrate various implementations of the semiconductor device 200 including examples of the characteristics described in association with FIGS. 7A-7C. Notably, the various implementations shown in FIGS. 7D-7F are provided for illustrative purposes and other examples are possible.

Notably, in the example implementations of the semiconductor device 200 shown in FIGS. 2-7F, a width of a given metal element 304 matches a width of a corresponding metal element 404 (e.g., a metal element 404 to which the given metal element 304 is bonded). FIG. 7G is a diagram illustrating an example implementation of the semiconductor device 200 in which a width of a given metal element 304 is different from a width of a corresponding metal element 404. As shown in FIG. 7G, one or more of metal elements 304 of the first wafer 202 may have different widths from one or more metal elements 404 of the second wafer 210. Notably, as shown, the widths of the metal elements 304 may vary among the metal elements 304, the widths of the metal elements 404 may vary among the metal elements 404, and/or the widths may vary among the metal elements 304 and the metal elements 404, collectively. In some implementations, the use of differing metal elements 304/404 with different widths (e.g., such that a given metal element 304 is wider than a corresponding metal element 404 or such that a given metal element 304 is narrower than a corresponding metal element 404) enables a process tolerance associated with bonding the first wafer 202 and the second wafer 210 to be more readily satisfied, thereby increasing yield and simplifying manufacture of the semiconductor device 200. As further illustrated in FIG. 7G (as well as in FIGS. 2-7F) a logical central axis of a metal element 304 is aligned with a logical axis of a corresponding metal element 404.

Figure 7H:
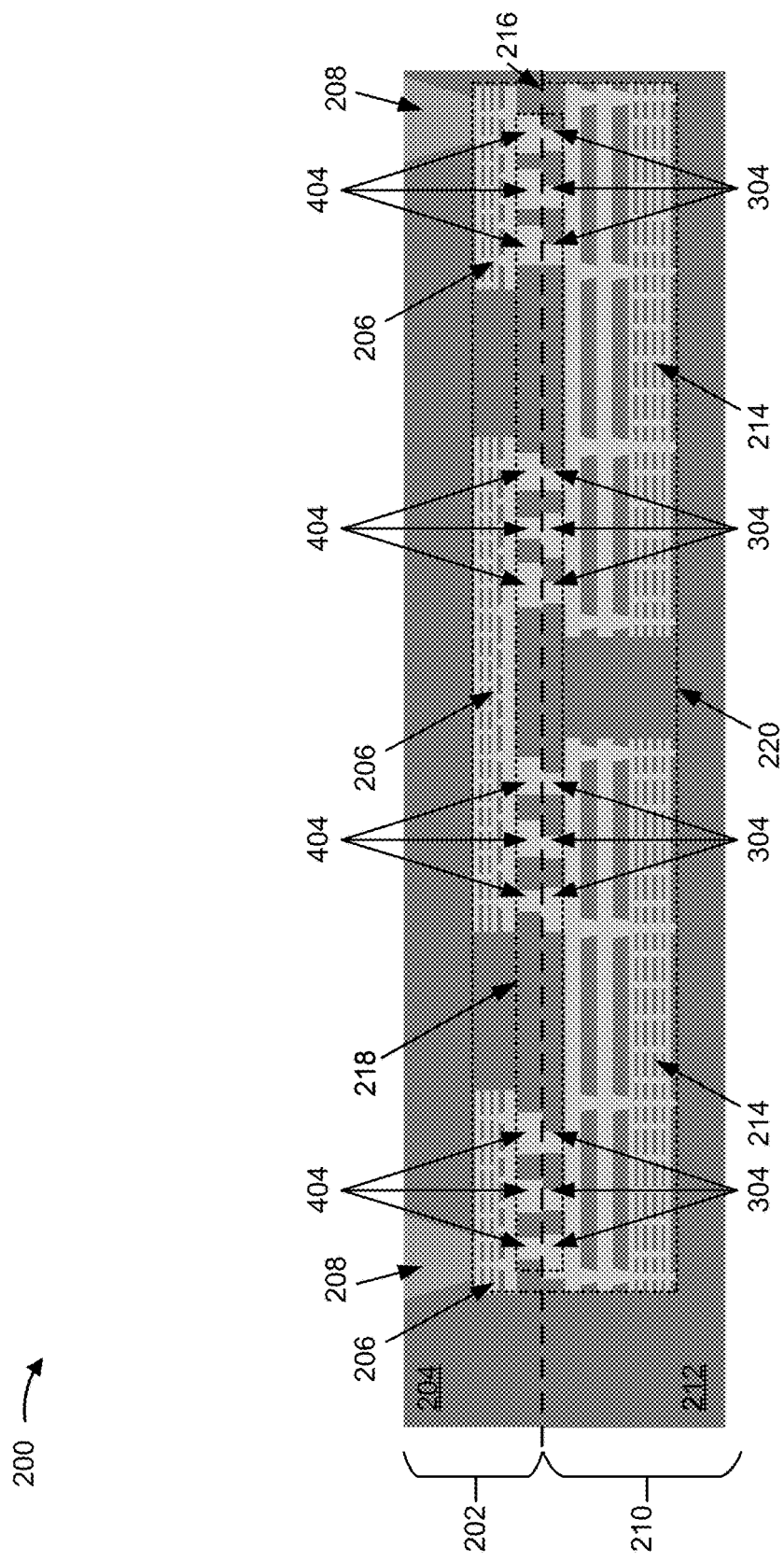

FIG. 7H is an example implementation of the semiconductor device 200 in which a logical central axis of a metal element 304 in the metal bonding structure 218 is not aligned with (e.g., is offset from) a logical central axis of a corresponding metal element 404 in the metal bonding structure 218. As shown in FIG. 7H, logical central axes of metal elements 304 in the metal bonding structure 218 are not aligned with logical central axes of corresponding metal elements 404 in the metal bonding structure 218 (i.e., the metal elements 304 are not centered on the metal elements 404). Notably, in this example, the different widths of the metal elements 304 and 404 enable the metal elements 304 and 404 to be bonded in order to form the metal bonding structure 218 of the daisy chain seal ring structure 220. In some implementations, as noted above, the metal elements 304 that are not centered on metal elements 404 enables a process tolerance associated with bonding the first wafer 202 and the second wafer 210 to be more readily satisfied, thereby increasing yield and simplifying manufacture of the semiconductor device 200.

Figure 7I:
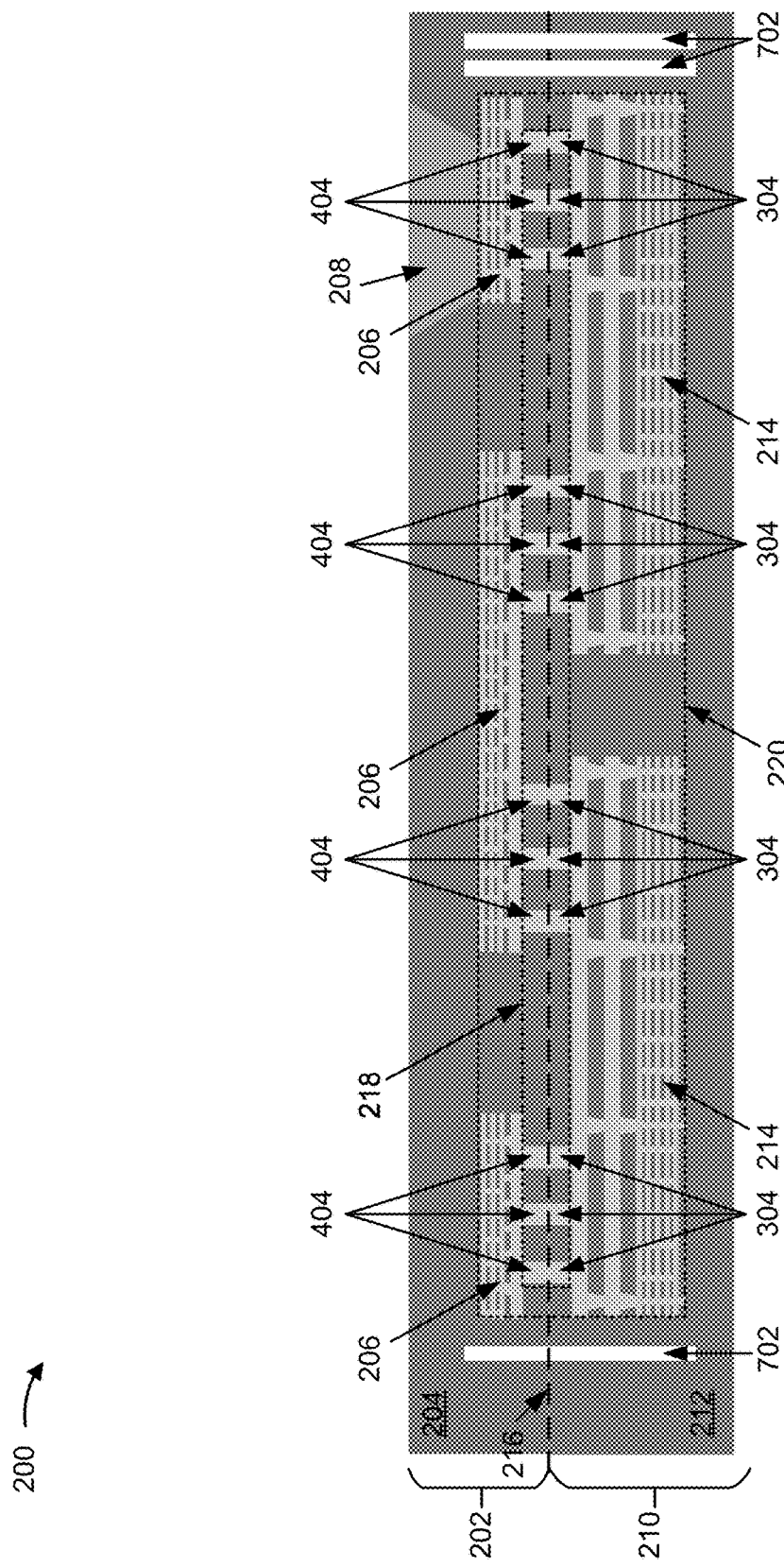

FIG. 7I is an example implementation of the semiconductor device 200 including a trench structure 702. The trench structure 702 includes one or more trench elements configured for reducing or preventing wafer cracking of the semiconductor device 200. As shown in FIG. 7I, the trench structure 702 includes one or more trench elements. In some implementations, a trench element, of the one or more trench elements, comprises a trench in the body 204 of the first wafer 202 and a trench in the body 212 of the second wafer 210. For example, in the semiconductor device 200 shown in FIG. 7I, the trench structure 702 includes three trench elements, where each trench element includes a trench in the body 212 and a trench in the body 204 (e.g., with the trenches in the body 204 being arranged over corresponding trenches in the body 212). In some implementations, the trench structure 702 includes a set of trench elements on a first side of the daisy chain seal ring structure 220 and a set of trench elements on a second (opposite) side of the daisy chain seal ring structure 220. As shown in FIG. 7I, in some implementations, an opening of a first trench in a given trench element at least partially overlaps an opening of a second trench of the given trench element. For example, an upper trench of a given trench element of the trench structure 702 at least partially overlaps a lower trench of the given trench element of the trench structure 702. In some implementations, the at least partial overlap of the upper and lower trenches of a given trench element enhances stress reduction or protection provided by the trench structure 702 (e.g., as compared to a trench element in which upper and lower trenches do not overlap).

As indicated above, FIGS. 7A-7I are provided as examples. Other examples may differ from what is described with regard to FIGS. 7A-7I.

FIG. 8 is a diagram of example components of a device 800, which may correspond to deposition tool 102, etching tool 104, planarization tool 106, bonding tool 108, and/or wafer/die transport tool 110. In some implementations, deposition tool 102, etching tool 104, planarization tool 106, bonding tool 108, and/or wafer/die transport tool 110 may include one or more devices 800 and/or one or more components of device 800. As shown in FIG. 8, device 800 may include a bus 810, a processor 820, a memory 830, a storage component 840, an input component 850, an output component 860, and a communication component 870.

Bus 810 includes a component that enables wired and/or wireless communication among the components of device 800. Processor 820 includes a central processing unit, a graphics processing unit, a microprocessor, a controller, a microcontroller, a digital signal processor, a field-programmable gate array, an application-specific integrated circuit, and/or another type of processing component. Processor 820 is implemented in hardware, firmware, or a combination of hardware and software. In some implementations, processor 820 includes one or more processors capable of being programmed to perform a function. Memory 830 includes a random access memory, a read only memory, and/or another type of memory (e.g., a flash memory, a magnetic memory, and/or an optical memory).

Storage component 840 stores information and/or software related to the operation of device 800. For example, storage component 840 may include a hard disk drive, a magnetic disk drive, an optical disk drive, a solid state disk drive, a compact disc, a digital versatile disc, and/or another type of non-transitory computer-readable medium. Input component 850 enables device 800 to receive input, such as user input and/or sensed inputs. For example, input component 850 may include a touch screen, a keyboard, a keypad, a mouse, a button, a microphone, a switch, a sensor, a global positioning system component, an accelerometer, a gyroscope, and/or an actuator. Output component 860 enables device 800 to provide output, such as via a display, a speaker, and/or one or more light-emitting diodes. Communication component 870 enables device 800 to communicate with other devices, such as via a wired connection and/or a wireless connection. For example, communication component 870 may include a receiver, a transmitter, a transceiver, a modem, a network interface card, and/or an antenna.

Device 800 may perform one or more processes described herein. For example, a non-transitory computer-readable medium (e.g., memory 830 and/or storage component 840) may store a set of instructions (e.g., one or more instructions, code, software code, and/or program code) for execution by processor 820. Processor 820 may execute the set of instructions to perform one or more processes described herein. In some implementations, execution of the set of instructions, by one or more processors 820, causes the one or more processors 820 and/or the device 800 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 8 are provided as an example. Device 800 may include additional components, fewer components, different components, or differently arranged components than those shown in FIG. 8. Additionally, or alternatively, a set of components (e.g., one or more components) of device 800 may perform one or more functions described as being performed by another set of components of device 800.

Figure 9:
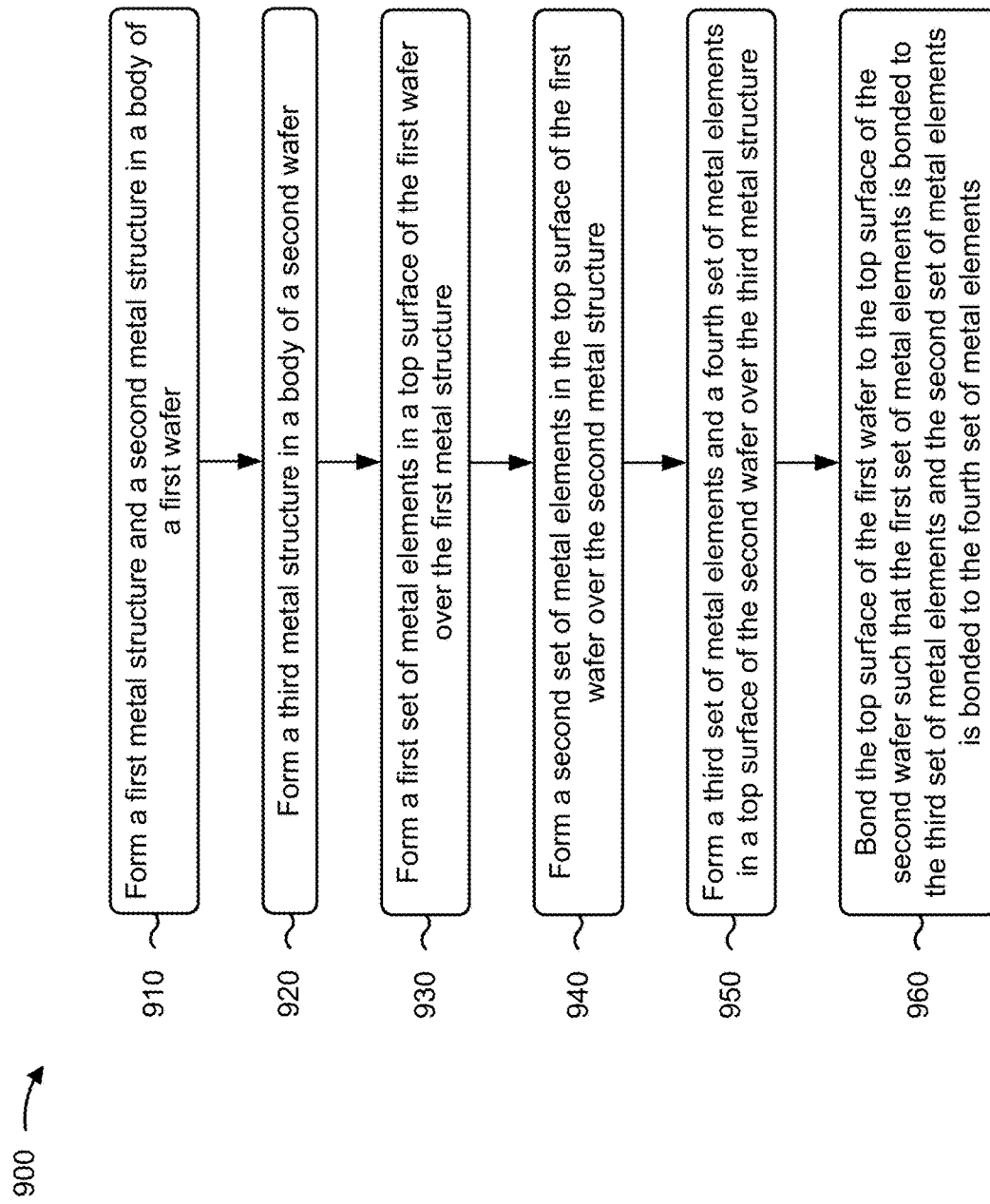
FIG. 9 is a flowchart of an example process relating to forming a daisy chain seal ring structure.

FIG. 9 is a flowchart of an example process 900 associated with a daisy chain seal ring structure and manufacturing method thereof. In some implementations, one or more process blocks of FIG. 9 may be performed by one or more semiconductor processing tools (e.g., deposition tool 102, etching tool 104, planarization tool 106, bonding tool 108, and/or wafer/die transport tool 110). Additionally, or alternatively, one or more process blocks of FIG. 9 may be performed by one or more components of device 800, such as processor 820, memory 830, storage component 840, input component 850, output component 860, and/or communication component 870.

As shown in FIG. 9, process 900 may include forming a first metal structure and a second metal structure in a body of a first wafer (block 910). For example, the one or more semiconductor processing tools may form a first metal structure (e.g., a metal structure 206) and a second metal structure (e.g., a metal structure 206) in a body of a first wafer (e.g., a body 204 of the first wafer 202), as described above.

As further shown in FIG. 9, process 900 may include forming a third metal structure in a body of a second wafer (block 920). For example, the one or more semiconductor processing tools may form a third metal structure (e.g., a metal structure 214) in a body of a second wafer (e.g., a body 212 of a second wafer 210), as described above.

As further shown in FIG. 9, process 900 may include forming a first set of metal elements extending from a top surface of the first wafer to the first metal structure (block 930). For example, the one or more semiconductor processing tools may form a first set of metal elements (e.g., a set of metal elements 404) extending from a top surface of the first wafer to the first metal structure, as described above.

As further shown in FIG. 9, process 900 may include forming a second set of metal elements extending from the top surface of the first wafer to the second metal structure (block 940). For example, the one or more semiconductor processing tools may form a second set of metal elements (e.g., a set of metal elements 404) extending from the top surface of the first wafer to the second metal structure, as described above.

As further shown in FIG. 9, process 900 may include forming a third set of metal elements and a fourth set of metal elements extending from a top surface of the second wafer to the third metal structure (block 950). For example, the one or more semiconductor processing tools may form a third set of metal elements (e.g., a set of metal elements 304) and a fourth set of metal elements (e.g., a set of metal elements 304) extending from a top surface of the second wafer to the third metal structure, as described above.

As further shown in FIG. 9, process 900 may include bonding the top surface of the first wafer to the top surface of the second wafer such that the first set of metal elements is bonded to the third set of metal elements and the second set of metal elements is bonded to the fourth set of metal elements (block 960). For example, the one or more semiconductor processing tools may bond the top surface of the first wafer to the top surface of the second wafer such that the first set of metal elements is bonded to the third set of metal elements and the second set of metal elements is bonded to the fourth set of metal elements, as described above.

Process 900 may include additional implementations, such as any single implementation or any combination of implementations described below and/or in connection with one or more other processes described elsewhere herein.

In a first implementation, process 900 includes forming a first trench structure (e.g., a trench structure 208) extending from the top surface of the first wafer to a surface of the first metal structure, and forming a second trench structure (e.g., a trench structure 208) extending from the top surface of the first wafer to the second metal structure.

In a second implementation, alone or in combination with the first implementation, process 900 includes forming a first trench structure (e.g., a trench structure 208) extending from the top surface of the first wafer to a surface of the first metal structure, and forming a second trench structure (e.g., a trench structure 208) extending from the top surface of the second wafer to the third metal structure.

In a third implementation, alone or in combination with one or more of the first and second implementations, a shape or a size of a metal element, in a set of metal elements of the first set of metal elements, the second set of metal elements, the third set of metal elements, or the fourth set of metal elements, is different from a shape or a size of a metal element in another set of metal elements of the first set of metal elements, the second set of metal elements, the third set of metal elements, or the fourth set of metal elements.

In a fourth implementation, alone or in combination with one or more of the first through third implementations, the first metal structure, the second metal structure, the third metal structure, the first set of metal elements, the second set of metal elements, the third set of metal elements, and the fourth set of metal elements form a daisy chain seal ring structure.

In a fifth implementation, alone or in combination with one or more of the first through fourth implementations, one or more of the first metal structure, the second metal structure, the third metal structure, the first set of metal elements, the second set of metal elements, the third set of metal elements, and the fourth set of metal elements include a test pattern to be used for performing a wafer acceptance test.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

The daisy chain seal ring structure 220 described herein improves reliability of the seal ring structure 220 and/or reduces stress induced at the interface 216 of the semiconductor device 200 during a sawing or cutting process. For example, in some implementations, the daisy chain seal ring structure 220 further reduces stress (e.g., induced due to stress from a die sawing or cutting process) at the interface 216 of the first wafer 202 and the second wafer 210, thereby improving reliability and reducing stress at the interface 216 and, as a result, reducing a likelihood of wafer cracking. Further, the daisy chain seal ring structure 220 described herein can improve contamination prevention (e.g., by preventing contaminants from penetrating the semiconductor device circuit). For these reasons, daisy chain the seal ring structure 220 described can improve manufacturing yield of a semiconductor device, such as a CMOS integrated circuit, and reduce manufacturing downtime.

Additionally, in some implementations, the daisy chain seal ring structure 220 may be configured with at least a portion of a test pattern to be used in association with performing, for example, a WAT. That is, in some implementations, a test pattern may be at least partially incorporated in the daisy chain seal ring structure 220. In such a case, the semiconductor device 200 may further include one or more trench structures 208 over portions of the seal ring structure 220, meaning that a size of a scribe line region can be reduced, thereby increasing a die area on the wafer (e.g., such that a quantity of semiconductor devices formed on the wafer may be increased).

As described in greater detail above, some implementations described herein provide a semiconductor device. The semiconductor device includes a first wafer. The semiconductor device includes a second wafer. The semiconductor device includes a seal ring structure comprising, a first metal structure in a body of the first wafer, a second metal structure in the body of the first wafer, a third metal structure in a body of the second wafer, and a metal bonding structure including a first set of metal elements coupling the first metal structure and the third metal structure through an interface between the first wafer and the second wafer, and a second set of metal elements coupling the second metal structure and the third metal structure through the interface between the first wafer and the second wafer.

As described in greater detail above, some implementations described herein provide a method. The method includes forming a first metal structure and a second metal structure in a body of a first wafer. The method includes forming a third metal structure in a body of a second wafer. The method includes forming a first set of metal elements extending from a top surface of the first wafer to the first metal structure. The method includes forming a second set of metal elements extending from the top surface of the first wafer to the second metal structure. The method includes forming a third set of metal elements and a fourth set of metal elements extending from a top surface of the second wafer to the third metal structure. The method includes bonding the top surface of the first wafer to the top surface of the second wafer such that the first set of metal elements is bonded to the third set of metal elements and the second set of metal elements is bonded to the fourth set of metal elements.

As described in greater detail above, some implementations described herein provide a device. The device includes a first wafer comprising a first metal structure and a second metal structure, the second metal structure being adjacent to the first metal structure. The device includes a second wafer comprising a third metal structure. The device includes a metal bonding structure including, a first set of metal elements connecting the first metal structure to the third metal structure, and a second set of metal elements connecting the second metal structure to the third metal structure, where a daisy chain seal ring structure is formed in the first wafer and the second wafer by the first metal structure, the first set of metal elements, the third metal structure, the second set of metal elements, and the second metal structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first wafer;
   a second wafer; and
   a seal ring structure comprising:
      a first metal structure in a body of the first wafer,
      a second metal structure in the body of the first wafer,
      a third metal structure in a body of the second wafer, and
      a metal bonding structure including:
         a first set of metal elements coupling the first metal structure and the third metal structure through an interface between the first wafer and the second wafer, and
         a second set of metal elements coupling the second metal structure and the third metal structure through the interface between the first wafer and the second wafer.

2. The semiconductor device of claim 1, wherein the seal ring structure further comprises a fourth metal structure in the body of the first wafer and a fifth metal structure in the body of the second wafer, and the metal bonding structure further comprises:
   a third set of metal elements coupling the second metal structure and the fifth metal structure through the interface between the first wafer and the second wafer, and
   a fourth set of metal elements coupling the fifth metal structure and the fourth metal structure through the interface between the first wafer and the second wafer.

3. The semiconductor device of claim 1, further comprising a first trench structure and a second trench structure,
   wherein the first trench structure is in the body of the first wafer and extends from a surface of the first wafer to the first metal structure, and
   wherein the second trench structure is in the body of the first wafer and extends from the surface of the first wafer to the second metal structure.

4. The semiconductor device of claim 1, further comprising a first trench structure and a second trench structure,
   wherein the first trench structure is in the body of the first wafer and extends from a surface of the first wafer to the first metal structure, and
   wherein the second trench structure is in the body of the second wafer and extends from a surface of the second wafer to the third metal structure.

5. The semiconductor device of claim 1, wherein a particular set of metal elements, of the first set of metal elements or the second set of metal elements, comprises:
   a first metal element that extends from the first metal structure or the second metal structure in the body of the first wafer to the interface, and
   a second metal element that extends from the third metal structure in the body of the second wafer to the interface,
      wherein the first metal element is bonded to the second metal element at the interface between the first wafer and the second wafer.

6. The semiconductor device of claim 5, wherein a cross-sectional shape of the first metal element is different from a cross-sectional shape of the second metal element.

7. The semiconductor device of claim 5, wherein a width of the first metal element at the interface is different from a width of the second metal element at the interface.

8. The semiconductor device of claim 1, wherein the seal ring structure includes at least a portion of a test pattern associated with performing a wafer test.

9. A method, comprising:
   forming a first metal structure and a second metal structure in a body of a first wafer;
   forming a third metal structure in a body of a second wafer;
   forming a first set of metal elements extending from a top surface of the first wafer to the first metal structure;
   forming a second set of metal elements extending from the top surface of the first wafer to the second metal structure;
   forming a third set of metal elements and a fourth set of metal elements extending from a top surface of the second wafer to the third metal structure; and
   bonding the top surface of the first wafer to the top surface of the second wafer such that the first set of metal elements is bonded to the third set of metal elements and the second set of metal elements is bonded to the fourth set of metal elements.

10. The method of claim 9, further comprising:
    forming a fourth metal structure in the body of the first wafer;
    forming a fifth metal structure in the body of the second wafer;
    forming a fifth set of metal elements extending from the top surface of the first wafer to the second metal structure;
    forming a sixth set of metal elements extending from the top surface of the first wafer to the fourth metal structure; and
    forming a seventh set of metal elements and an eighth set of metal elements extending from the top surface of the second wafer to the fifth metal structure,
       wherein the top surface of the first wafer is bonded to the top surface of the second wafer such that the fifth set of metal elements is bonded to the seventh set of metal elements and the sixth set of metal elements is bonded to the eighth set of metal elements.

11. The method of claim 9, further comprising:
    forming a first trench structure extending from the top surface of the first wafer to a surface of the first metal structure, and
    forming a second trench structure extending from the top surface of the first wafer to the second metal structure.

12. The method of claim 9, further comprising:
    forming a first trench structure extending from the top surface of the first wafer to a surface of the first metal structure, and
    forming a second trench structure extending from the top surface of the second wafer to the third metal structure.

13. The method of claim 9, wherein a shape or a size of a metal element, in a set of metal elements of the first set of metal elements, the second set of metal elements, the third set of metal elements, or the fourth set of metal elements, is different from a shape or a size of a metal element in another set of metal elements of the first set of metal elements, the second set of metal elements, the third set of metal elements, or the fourth set of metal elements.

14. The method of claim 9, wherein the first metal structure, the second metal structure, the third metal structure, the first set of metal elements, the second set of metal elements, the third set of metal elements, and the fourth set of metal elements form a daisy chain seal ring structure.

15. The method of claim 9, wherein one or more of the first metal structure, the second metal structure, the third metal structure, the first set of metal elements, the second set of metal elements, the third set of metal elements, and the fourth set of metal elements include a test pattern to be used for performing a wafer acceptance test.

16. A device, comprising:
a first wafer comprising a first metal structure and a second metal structure, the second metal structure being adjacent to the first metal structure;
a second wafer comprising a third metal structure; and
a metal bonding structure including:
a first set of metal elements connecting the first metal structure to the third metal structure, and
a second set of metal elements connecting the second metal structure to the third metal structure,
wherein a daisy chain seal ring structure is formed in the first wafer and the second wafer by the first metal structure, the first set of metal elements, the third metal structure, the second set of metal elements, and the second metal structure.

17. The device of claim 16, wherein the first wafer further comprises a fourth metal structure adjacent to the second metal structure and the second wafer further comprises a fifth metal structure adjacent to the third metal structure, and the metal bonding structure further includes:
a third set of metal elements connecting the second metal structure to the fifth metal structure, and
a fourth set of metal elements connecting the fourth metal structure to the fifth metal structure.

18. The device of claim 17, further comprising a first trench structure and a second trench structure,
wherein the first trench structure is in a body of the first wafer and exposes a surface of the first metal structure, and
wherein the second trench structure is either in:
the body of the first wafer and exposes a surface of the second metal structure or the fourth metal structure, or
a body of the second wafer and exposes a surface of the third metal structure or the fifth metal structure.

19. The device of claim 16, wherein shapes or widths differ among metal elements in at least one of the first set of metal elements or the second set of metal elements.

20. The device of claim 16, wherein the daisy chain seal ring structure includes at least a portion of a test pattern associated with performing a wafer test.

* * * * *